United States Patent
Kang et al.

(10) Patent No.: US 12,283,529 B2
(45) Date of Patent: Apr. 22, 2025

(54) METHOD OF REPAIRING THROUGH-ELECTRODES, REPAIR DEVICE PERFORMING THE SAME AND SEMICONDUCTOR DEVICE INCLUDING THE SAME

(71) Applicant: Samsung Electronics Co., Ltd., Suwon-si (KR)

(72) Inventors: Sungho Kang, Seoul (KR); Youngkwang Lee, Ansan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 412 days.

(21) Appl. No.: 17/660,920

(22) Filed: Apr. 27, 2022

(65) Prior Publication Data
US 2023/0072965 A1  Mar. 9, 2023

(30) Foreign Application Priority Data
Sep. 8, 2021  (KR) .................... 10-2021-0119552

(51) Int. Cl.
*H01L 21/66* (2006.01)
*H01L 23/48* (2006.01)
*H03K 17/00* (2006.01)

(52) U.S. Cl.
CPC .............. *H01L 22/22* (2013.01); *H01L 22/14* (2013.01); *H01L 22/32* (2013.01); *H01L 23/481* (2013.01); *H03K 17/005* (2013.01)

(58) Field of Classification Search
CPC ....................................................... H01L 22/22
See application file for complete search history.

(56) References Cited

U.S. PATENT DOCUMENTS 5,414,637 A * 5/1995 Bertin ................. H01L 23/5384
257/E21.526
9,157,960 B2 * 10/2015 Bringivijayaraghavan ................
H01L 22/22

(Continued)

FOREIGN PATENT DOCUMENTS

KR    1020120058156 A    6/2012
KR      101748952 B1     6/2017

*Primary Examiner* — David A Zarneke
(74) *Attorney, Agent, or Firm* — Wolf, Greenfield & Sacks, P.C.

(57) ABSTRACT

In a method of repairing through-electrodes, a plurality of through-electrodes are grouped into a plurality of through-electrode groups. A plurality of redundant through-electrodes are grouped into a plurality of redundant through-electrode groups. Repair paths for the plurality of through-electrodes are searched. When searching the repair paths, in response to a Y-th through-electrode included in an X-th through-electrode group being a defective through-electrode or in response to receiving a first signal from an (X−1)-th through-electrode group, it is determined whether a y-th redundant through-electrode included in an x-th redundant through-electrode group is available for performing signal transmission thereto. In response to the y-th redundant through-electrode being available for performing signal transmission thereto, a second signal input to the Y-th through-electrode is transmitted to the y-th redundant through-electrode. In response to the y-th redundant through-electrode being unavailable for performing signal transmission thereto, the second signal input to the Y-th through-electrode is transmitted to an (X+1)-th through-electrode group.

13 Claims, 13 Drawing Sheets

(56) References Cited

U.S. PATENT DOCUMENTS

| | | |
|---|---|---|
| 9,941,192 B2 | 4/2018 | Baeg et al. |
| 9,995,785 B2 | 6/2018 | Pappu et al. |
| 10,079,221 B2 | 9/2018 | Lee |
| 10,170,398 B2 * | 1/2019 | Kang ............... H01L 23/58 |
| 10,403,555 B2 * | 9/2019 | Kang ............. H01L 25/0657 |
| 11,164,856 B2 * | 11/2021 | Makabe ............. G11C 29/025 |
| 11,327,109 B2 * | 5/2022 | Jeong ............ H01L 25/0657 |
| 2013/0214389 A1 | 8/2013 | Lee et al. |

* cited by examiner

METHOD OF REPAIRING THROUGH-ELECTRODES, REPAIR DEVICE PERFORMING THE SAME AND SEMICONDUCTOR DEVICE INCLUDING THE SAME

CROSS-REFERENCE TO RELATED APPLICATION

This application claims priority under 35 USC § 119 to Korean Patent Application No. 10-2021-0119552 filed on Sep. 8, 2021 in the Korean Intellectual Property Office (KIPO), the contents of which are herein incorporated by reference in their entirety.

BACKGROUND

1. Technical Field

Example embodiments relate generally to semiconductor integrated circuits, and more particularly to methods of repairing through-electrodes included in semiconductor devices, repair devices configured to perform the methods of repairing the through-electrodes, and semiconductor devices including the repair devices.

2. Description of the Related Art

With the recent trend of high capacity, light weight and high density electronic products, the operating voltage and size of electronic devices may also decrease. The conventional planar two-dimensional mounting method may suffer from problems, such as increase in package area due to increase in the number of input/output (I/O) pads and slow signal transmission, and thus the mounting method may be falling out of favor based on current trends in the electronics industry. Accordingly, three-dimensional packaging in which semiconductor devices and/or integrated circuits (ICs) are mounted by vertically stacking has been researched. For example, through-silicon via (TSV) technology of forming via holes in a silicon wafer and using the same as electrical paths has been attracting attention.

However, the use of TSV technology may have other shortcomings. For example, failures when using TSV technology may include, but are not limited to, a void which is generated by incomplete filling of the inside of through-silicon vias (TSVs) with a conductive material in the process of forming TSVs, a bump contact failure caused by bending of a semiconductor chip or movement of a bump material, a crack that occurs in a TSV itself, and the like. As described above, a TSV serves as a mediator for electrically connecting a plurality of semiconductor chips. Thus, when the TSV fails, its function as an electrode may also fail. In this case, a repair technique capable of replacing failed TSVs with operable TSVs may be used.

SUMMARY

At least one example embodiment of the present inventive concept provides a method of efficiently repairing through-electrodes, e.g., TSVs, when a failure or defect occurs on the through-electrodes.

At least one example embodiment of the present inventive concept provides a repair device configured to perform the method of repairing the through-electrodes and a semiconductor device including the repair device.

According to example embodiments, in a method of repairing through-electrodes, a plurality of through-electrodes are grouped into a plurality of through-electrode groups arranged in a circular structure. The plurality of through-electrodes are configured for signal transmissions. Each through-electrode group includes two or more through-electrodes. A plurality of redundant through-electrodes are grouped into a plurality of redundant through-electrode groups. The plurality of redundant through-electrodes are configured to replace the plurality of through-electrodes in response to the plurality of through-electrodes being defective. Each redundant through-electrode group includes at least one redundant through-electrode and corresponds to at least one through-electrode group. Repair paths for the plurality of through-electrodes are searched. When searching the repair paths, in response to a Y-th through-electrode included in an X-th through-electrode group being a defective through-electrode or in response to receiving a first signal from an (X−1)-th through-electrode group, it is determined whether to a y-th redundant through-electrode included in an x-th redundant through-electrode group corresponding to the X-th through-electrode group is available for performing signal transmission thereto, where X is a natural number greater than or equal to one and less than or equal to M, where Y is a natural number greater than or equal to one and less than or equal to N, where x is a natural number greater than or equal to one and less than or equal to m, where y is a natural number greater than or equal to one and less than or equal to n. In response to the y-th redundant through-electrode being available for performing signal transmission thereto, a second signal input to the Y-th through-electrode is transmitted to the y-th redundant through-electrode. In response to the y-th redundant through-electrode being unavailable for performing signal transmission thereto, the second signal input to the Y-th through-electrode is transmitted to an (X+1)-th through-electrode group.

According to example embodiments, a repair device includes a router circuit and a path search circuit. The router circuit is connected to a plurality of through-electrodes and a plurality of redundant through-electrodes. The plurality of through-electrodes are configured for signal transmissions. The plurality of redundant through-electrodes are configured to replace the plurality of through-electrodes in response to the plurality of through-electrodes being defective. The path search circuit controls the router circuit and searches repair paths for the plurality of through-electrodes. The plurality of through-electrodes are grouped into a plurality of through-electrode groups arranged in a circular structure. Each through-electrode group includes two or more through-electrodes. The plurality of redundant through-electrodes are grouped into a plurality of redundant through-electrode groups. Each redundant through-electrode group includes at least one redundant through-electrode and corresponds to at least one through-electrode group. The path search circuit is configured to search the repair paths by performing operations comprising: in response to a Y-th through-electrode included in an X-th through-electrode group being a defective through-electrode or in response to receiving a first signal from an (X−1)-th through-electrode group, determining whether a y-th redundant through-electrode included in an x-th redundant through-electrode group corresponding to the X-th through-electrode group is available for performing signal transmission thereto, where X is a natural number greater than or equal to one and less than or equal to M, where Y is a natural number greater than or equal to one and less than or equal to N, where x is a natural number greater than or equal to one and less than or equal to m, where y is a natural number greater than or equal to one and less than or equal to n, in response to the y-th redundant through-electrode being available for performing signal transmission thereto, transmitting a second signal input to the Y-th through-electrode to the y-th redundant through-electrode, and in response to the y-th redundant through-electrode being unavailable for performing signal transmission thereto, transmitting the second signal input to the Y-th through-electrode to an (X+1)-th through-electrode group.

According to example embodiments, a semiconductor device includes a first semiconductor chip, a second semiconductor chip and a first repair device. The first semiconductor chip includes a first semiconductor substrate, a plurality of first through-electrodes penetrating the first semiconductor substrate, a plurality of first redundant through-electrodes penetrating the first semiconductor substrate, and a plurality of first semiconductor elements. The plurality of first redundant through-electrodes are configured to replace the plurality of first through-electrodes in response to the plurality of first through-electrodes being defective. The second semiconductor chip includes a second semiconductor substrate, a plurality of second through-electrodes penetrating the second semiconductor substrate, a plurality of second redundant through-electrodes penetrating the second semiconductor substrate, and a plurality of second semiconductor elements. The plurality of second redundant through-electrodes are configured to replace the plurality of second through-electrodes in response to the plurality of second through-electrodes being defective. The first repair device performs a repair operation on the plurality of first and second through-electrodes. The first and second semiconductor chips are vertically stacked and are electrically connected by the plurality of first and second through-electrodes. The first repair device includes a first router circuit and a first path search circuit. The first router circuit is connected to the plurality of first and second through-electrodes and the plurality of first and second redundant through-electrodes. The first path search circuit controls the first router circuit and searches repair paths for the plurality of first and second through-electrodes. The plurality of first and second through-electrodes are grouped into a plurality of through-electrode groups arranged in a circular structure, respectively. Each through-electrode group includes two or more through-electrodes. The plurality of first and second redundant through-electrodes are grouped into a plurality of redundant through-electrode groups, respectively. Each redundant through-electrode group includes at least one redundant through-electrode and corresponds to at least one through-electrode group. The first path search circuit searches the repair paths by, in response to a Y-th through-electrode included in an X-th through-electrode group being a defective through-electrode or in response to receiving a first signal from an (X−1)-th through-electrode group, determining whether a y-th redundant through-electrode included in an x-th redundant through-electrode group corresponding to the X-th through-electrode group is available for performing signal transmission thereto, where X is a natural number greater than or equal to one and less than or equal to M, where Y is a natural number greater than or equal to one and less than or equal to N, where x is a natural number greater than or equal to one and less than or equal to m, where y is a natural number greater than or equal to one and less than or equal to n, in response to the y-th redundant through-electrode being available for performing signal transmission thereto, transmitting a second signal input to the Y-th through-electrode to the y-th redundant through-electrode, and in response to the y-th redundant through-electrode being unavailable for performing signal transmission thereto, transmitting the second signal input to the Y-th through-electrode to an (X+1)-th through-electrode group.

In the method of repairing the through-electrodes, the repair device and the semiconductor device according to example embodiments, the through-electrodes and the redundant through-electrodes may be grouped, respectively. When a through-electrode included in a specific through-electrode group is the defective through-electrode, the defective through-electrode may be preferentially repaired using the redundant through-electrode included in the corresponding redundant through-electrode group. When the number of defective through-electrodes in a specific through-electrode group is greater than the number of redundant through-electrodes included in the corresponding redundant through-electrode group, the defective through-electrode may be repaired using the redundant through-electrode included in the next or adjacent redundant through-electrode group. Accordingly, a relatively high repair rate may be guaranteed using a relatively small number of redundant through-electrodes.

In addition, the router circuit and the path circuit included in the repair device, which is configured to perform the above-described repair path, may have a relatively small size, and thus the complexity of circuits may be reduced and hardware overhead efficiency may be improved. Additionally, the repair path search may be easily, quickly and/or efficiently performed.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
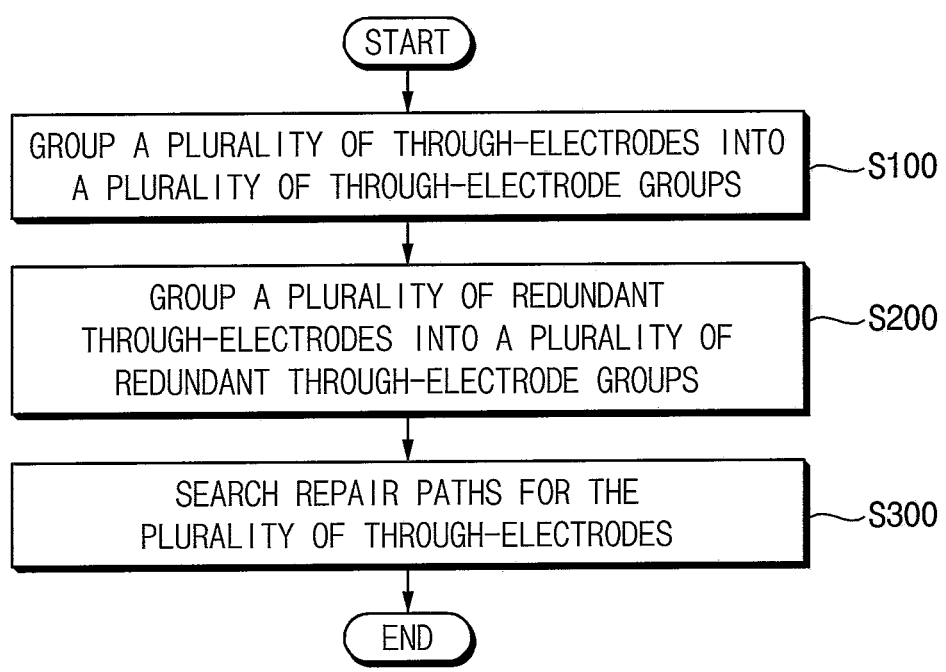
FIG. 1 is a flowchart illustrating a method of repairing through-electrodes according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a flowchart illustrating a method of repairing through-electrodes according to example embodiments.

Referring to FIG. 1, a method of repairing through-electrodes according to example embodiments is performed by a repair device that includes a router circuit and a path search circuit. The through-electrodes, which are to be repaired or are a target of a repair operation, are included in a semiconductor device in which a plurality of semiconductor chips are stacked. A configuration of the repair device will be described with reference to FIG. 3. Configurations of the through-electrodes and the semiconductor device will be described with reference to FIGS. 4 and 12.

In the method of repairing the through-electrodes according to example embodiments, a plurality of through-electrodes are grouped into a plurality of through-electrode groups (block S100). The plurality of through-electrodes are used for signal transmissions between the semiconductor chips included in the semiconductor device. The plurality of through-electrodes may be referred to as signal through-electrodes or main through-electrodes. The plurality of through-electrode groups are arranged in a circular structure (or a ring structure or closed-loop structure). Each of the plurality of through-electrode groups includes two or more through-electrodes.

In some example embodiments, the number of the plurality of through-electrodes may be N, where N is a natural number greater than or equal to two, and the number of the plurality of through-electrode groups may be M, where M is a natural number greater than or equal to two. For example, when the same number of through-electrodes are included in all of the plurality of through-electrode groups, and when the number of through-electrodes included in one through-electrode group is K, where K is a natural number greater than or equal to two, M=N/K.

A plurality of redundant through-electrodes are grouped into a plurality of redundant through-electrode groups (block S200). The plurality of redundant through-electrodes are used to replace the plurality of through-electrodes when the plurality of through-electrodes are defective or have failures. The plurality of redundant through-electrodes may be referred to as repair through-electrodes, spare through-electrodes or auxiliary through-electrodes. Each of the plurality of redundant through-electrode groups includes at least one redundant through-electrode and corresponds to at least one through-electrode group.

In some example embodiments, the number of the plurality of redundant through-electrodes may be n, where n is a natural number greater than or equal to two, and the number of the plurality of redundant through-electrode groups may be m, where m is a natural number greater than or equal to two. For example, when the same number of redundant through-electrodes are included in all of the plurality of redundant through-electrode groups, and when the number of redundant through-electrodes included in one redundant through-electrode group is k, where k is a natural number greater than or equal to one, m=n/k.

In some example embodiments, the number of the plurality of through-electrode groups and the number of the plurality of redundant through-electrode groups may be equal to each other (e.g., M=m). In other example embodiments, the number of the plurality of through-electrode groups and the number of the plurality of redundant through-electrode groups may be different from each other. For example, the number of the plurality of redundant through-electrode groups may be less than the number of the plurality of through-electrode groups (e.g., M>m).

Configurations of the plurality of through-electrode groups and the plurality of redundant through-electrode groups will be described with reference to FIGS. 5 to 10.

Repair paths for the plurality of through-electrodes are searched (block S300). For example, when the number of the plurality of through-electrodes is N, the repair paths may be sequentially searched from a first through-electrode to an N-th through-electrode, which is the last through-electrode. When the operation of block S300 is performed, a defective through-electrode or a failure through-electrode among the plurality of through-electrodes may be replaced or repaired with the redundant through-electrode.

Figure 2:
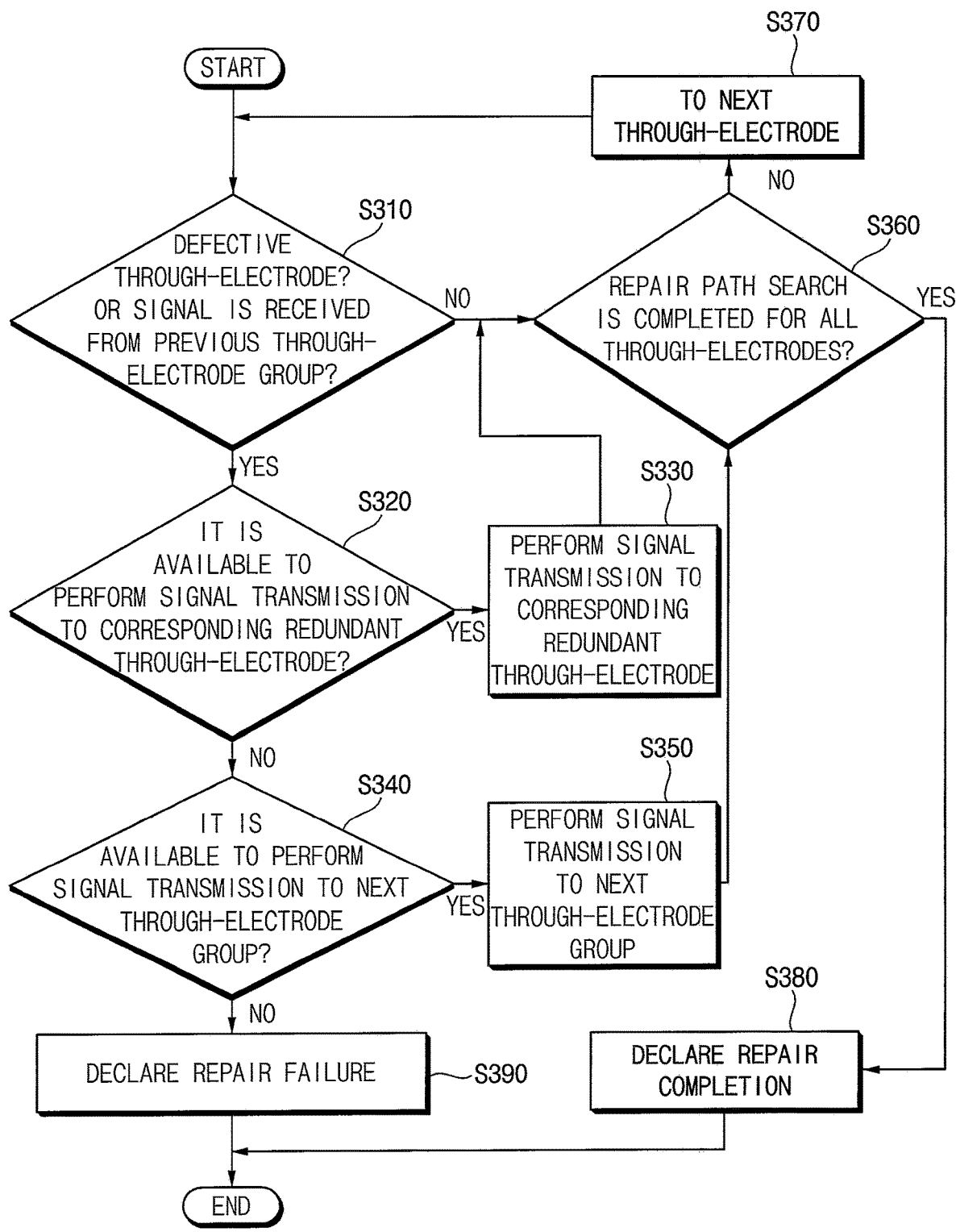
FIG. 2 is a flowchart illustrating an example of searching repair paths for a plurality of through-electrodes in FIG. 1.

FIG. 2 is a flowchart illustrating an example of searching repair paths for a plurality of through-electrodes in FIG. 1.

Referring to FIGS. 1 and 2, when searching the repair paths for the plurality of through-electrodes (block S300), an operation of searching a repair path for a Y-th through-electrode is illustrated, where Y is a natural number greater than or equal to one and less than or equal to N. The Y-th through-electrode may be a target of a present (or current) repair path search, and may be defined as a present through-electrode. In addition, the Y-th through-electrode may be included in an X-th through-electrode group, where X is a natural number greater than or equal to one and less than or equal to M. The X-th through-electrode group may be defined as a present through-electrode group including the Y-th through-electrode, which is the target of the present repair path search.

It may be determined whether the Y-th through-electrode included in the X-th through-electrode group is the defective through-electrode, or it may be determined whether the Y-th through-electrode receives a signal from a previous through-electrode group (block S310). The previous through-electrode group may be an (X−1)-th through-electrode group arranged at the front end of the X-th through-electrode group, which is the present through-electrode group, among the plurality of through-electrode groups formed in the circular structure. When X=1, the N-th through-electrode group may be the previous through-electrode group. For example, it may be determined whether the Y-th through-electrode receives a signal from one of through-electrodes included in the (X−1)-th through-electrode group.

When the Y-th through-electrode is the defective through-electrode or when the Y-th through-electrode receives the signal from the previous through-electrode group (block S310: YES), it may be determined whether redundant through-electrode included in a present redundant through-electrode group corresponding to the present through-electrode group is available for performing signal transmission thereto (block S320). The present redundant through-electrode group may be an x-th redundant through-electrode group corresponding to the X-th through-electrode group, which is the present through-electrode group, where x is a natural number greater than or equal to one and less than or equal to m. The redundant through-electrode included in the present redundant through-electrode group may be a y-th redundant through-electrode included in the x-th redundant through-electrode group, where y is a natural number greater than or equal to one and less than or equal to n. For example, it may be determined whether it is possible to transmit a signal (e.g., a Y-th input signal) input to the Y-th through-electrode to the y-th redundant through-electrode.

When the redundant through-electrode (e.g., to the y-th redundant through-electrode) included in the present redundant through-electrode group corresponding to the present through-electrode group is available for performing signal transmission thereto (block S320: YES), the signal (e.g., the Y-th input signal) input to the Y-th through-electrode may be transmitted to the y-th redundant through-electrode (block S330). In other words, the Y-th through-electrode may be immediately repaired with the y-th redundant through-electrode included in the present redundant through-electrode group.

When the redundant through-electrode (e.g., to the y-th redundant through-electrode) included in the present redundant through-electrode group corresponding to the present through-electrode group is unavailable for performing signal transmission thereto (block S320: NO), it may be determined whether a next through-electrode group is available for performing signal transmission thereto (block S340). The next through-electrode group may be an (X+1)-th through-electrode group arranged at the rear end of the X-th through-electrode group, which is the present through-electrode group, among the plurality of through-electrode groups formed in the circular structure. When X=N, the first through-electrode group may be the next through-electrode group. For example, it may be determined whether it is possible to transmit the signal (e.g., the Y-th input signal) input to the Y-th through-electrode to one of through-electrodes included in the (X+1)-th through-electrode group.

When y-th redundant through-electrode is unavailable for performing signal transmission thereto (block S320: NO), and when the next through-electrode group (e.g., to the (X+1)-th through-electrode group) is available for performing signal transmission thereto (block S340: YES), the signal (e.g., the Y-th input signal) input to the Y-th through-electrode may be transmitted to the (X+1)-th through-electrode group (block S350). In other words, although the Y-th through-electrode is not repaired with the y-th redundant through-electrode included in the present redundant through-electrode group, an appropriate action may be performed, such that the Y-th through-electrode is repaired with a redundant through-electrode included in a next redundant through-electrode group.

In some example embodiments, when the y-th redundant through-electrode is unavailable for performing signal transmission thereto (block S320: NO), and when the (X+1)-th through-electrode group is available for signal transmission thereto (block S340: YES), the signal (e.g., the Y-th input signal) input to the Y-th through-electrode may be transmitted to a Z-th through-electrode included in the (X+1)-th through-electrode group, where Z is a natural number greater than Y and less than or equal to N. In addition, a signal (e.g., a Z-th input signal) input to the Z-th through-electrode may be transmitted to a z-th redundant through-electrode included in the (x+1)-th redundant through-electrode group corresponding to the (X+1)-th through-electrode group, or may be transmitted to an (X+2)-th through-electrode group, where z is a natural number greater than y and less than or equal to n.

When the Y-th through-electrode is a normal (or non-defective) through-electrode, and when the Y-th through-electrode does not receive the signal from the previous through-electrode group (block S310: NO), the operation of searching the repair path for the Y-th through-electrode (or a repair path search for the Y-th through-electrode) may be terminated or finished, because an operation of repairing the Y-th through-electrode is not necessary.

Further, when the y-th redundant through-electrode is available for performing signal transmission thereto (block S320: YES), and when the signal (e.g., the Y-th input signal) input to the Y-th through-electrode is transmitted to the y-th redundant through-electrode (block S330), the operation of searching the repair path for the Y-th through-electrode may be terminated, because the Y-th through-electrode is immediately repaired.

Additionally, when the (X+1)-th through-electrode group is available for performing signal transmission thereto (block S340: YES), and when the signal (e.g., the Y-th input signal) input to the Y-th through-electrode is transmitted to the (X+1)-th through-electrode group (block S350), the operation of searching the repair path for the Y-th through-electrode may be terminated because it is determined that the Y-th through-electrode may be repaired later.

When the operation of searching the repair path for the Y-th through-electrode is terminated, it may be checked whether an operation of searching the repair paths for all of the plurality of through-electrodes (or a repair path search for all of the plurality of through-electrodes) is completed (block S360).

When the operation of searching the repair paths for all of the plurality of through-electrodes is not completed yet (block S360: NO), e.g., when a through-electrode that needs to be searched for a repair path still exists or still remains, a target of a repair path search may be changed to a (Y+1)-th through-electrode, which is a next through-electrode (block S370), and an operation of searching a repair path for the (Y+1)-th through-electrode may be performed. For example, Y may be increased by one (e.g., Y=Y+1), and the operations of blocks S310, S320, S330, S340 and S350 may be performed on the (Y+1)-th through-electrode.

When the operation of searching the repair paths for all of the plurality of through-electrodes is completed (block S360: YES), it may be determined that all defective through-electrodes are repaired. Thus, the repair process completion may be declared (block S380), and the repair process may be terminated.

When the Y-th through-electrode is the defective through-electrode or when the Y-th through-electrode receives the signal from the previous through-electrode group (block S310: YES), and when the y-th redundant through-electrode is unavailable for signal transmission thereto (block S320: NO), and when the (X+1)-th through-electrode group is unavailable for performing signal transmission thereto (block S340: NO), it may be determined that it may not be possible to repair the defective through-electrodes because all of the redundant through-electrodes have already been used for repair. Thus, the repair failure may be declared (block S390), and the repair process may be terminated.

The above-described operations may be sequentially performed from the first through-electrode included in the first through-electrode group to the N-th through-electrode included in the M-th through-electrode group. For example, operations in FIG. 2 may be performed by setting Y=1 at an initial operation time, and operations in FIG. 2 may be repeatedly performed while increasing Y by one.

In summary, if the present through-electrode is not faulty (or does not have a failure or defect) and if there is no signal sent from the previous through-electrode group, the path search may be performed on the next through-electrode, without changing the signal path of the present through-electrode. If the present through-electrode is faulty (or has the failure or defect) or if there is a signal from the previous through-electrode group, a first check may be made whether it is possible to send a signal intended to be sent to the present through-electrode to the present redundant through-electrode. If it is possible to transmit the signal to the present redundant through-electrode, the router circuit may be controlled, such that the signal is sent to the present redundant through-electrode. If the present redundant through-electrode does not exist, is already in use, or is also faulty, the signal path of the present through-electrode may be changed or modified, such that the signal is sent to a through-electrode, which is a normal and unused through-electrode and is included in the next through-electrode group. If there are several through-electrodes that satisfy such conditions, a through-electrode through which the path search is performed first may be designated (or assigned). If all defective through-electrodes are repaired or there is no longer a path to send a signal, the repair process may be terminated. If the repair paths are searched for all through-electrodes starting from the defective through-electrode, a path to any redundant through-electrode may be searched.

Figure 3:
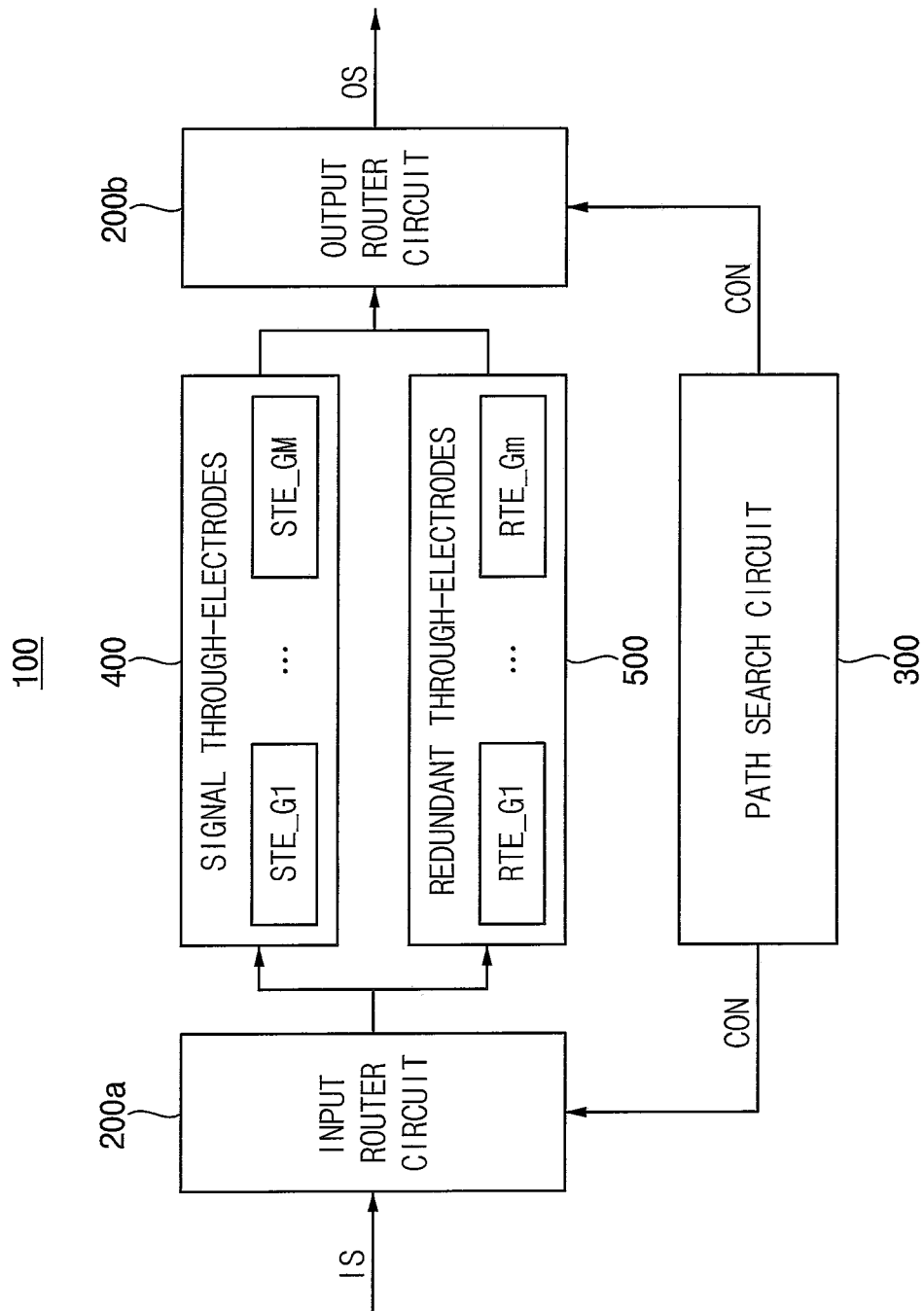
FIG. 3 is a block diagram illustrating a repair device according to example embodiments.

FIG. 3 is a block diagram illustrating a repair device according to example embodiments.

Referring to FIG. 3, a repair device 100 includes router circuits 200a and 200b and a path search circuit 300.

The router circuits 200a and 200b are connected to a plurality of through-electrodes 400 and a plurality of redundant through-electrodes 500. The plurality of through-electrodes 400 are used for signal transmissions, and the plurality of redundant through-electrodes 500 are used to replace the plurality of through-electrodes 400 when the plurality of through-electrodes 400 are defective.

The router circuits 200a and 200b may include an input router circuit 200a and an output router circuit 200b.

The input router circuit 200a may be configured to receive a plurality of input signals IS, and may transmit the plurality of input signals IS to the plurality of through-electrodes 400 and the plurality of redundant through-electrodes 500. The output router circuit 200b may be configured to provide signals transmitted from the plurality of through-electrodes 400 and the plurality of redundant through-electrodes 500 as a plurality of output signals OS.

Figure 5:
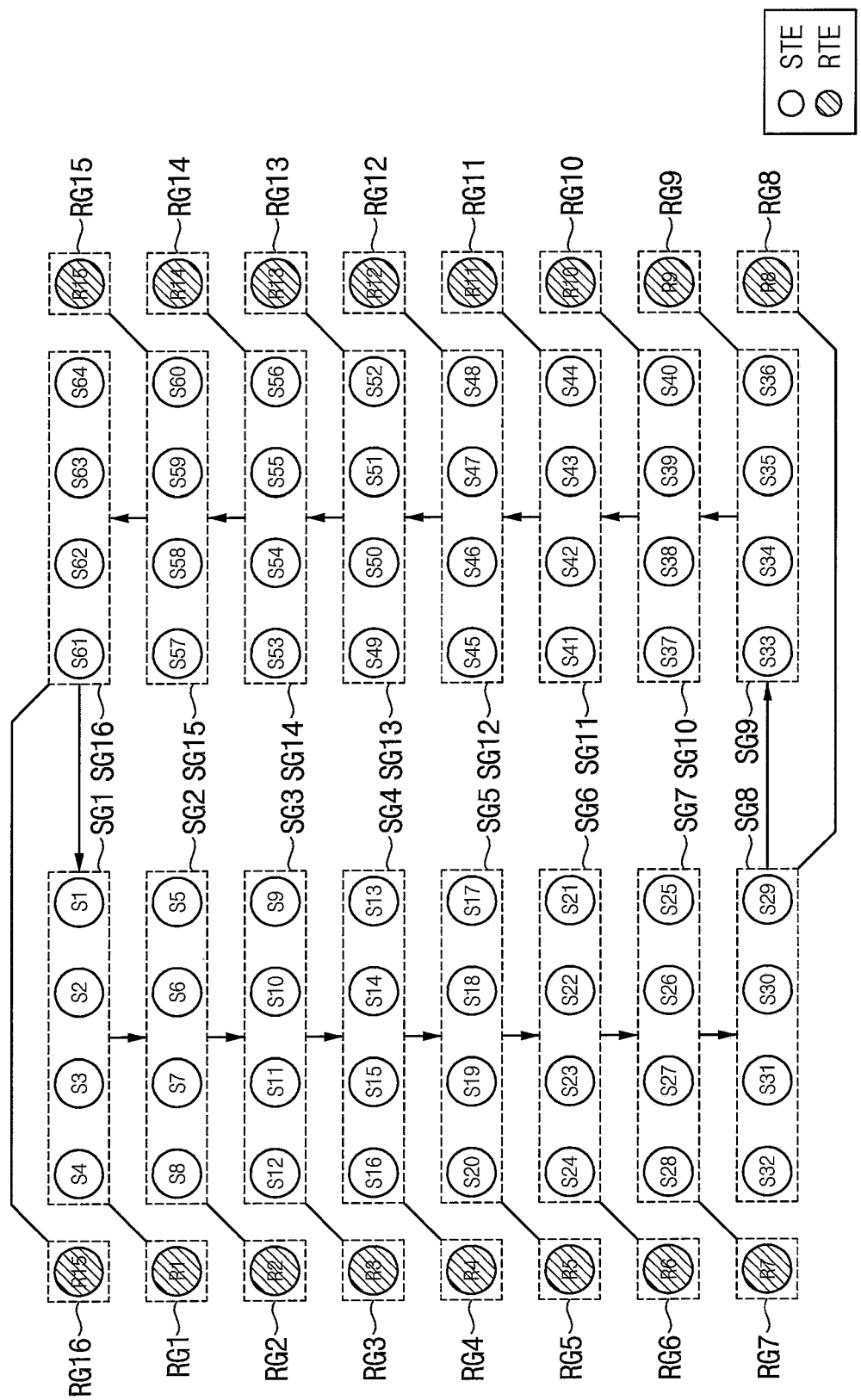
FIGS. 5 and 6 are diagrams illustrating examples of grouping through-electrodes and redundant through-electrodes for a repair operation performed according to example embodiments.

Although not illustrated in FIG. 5, the plurality of input signals IS may be received via a plurality of input pads (or pins), and the plurality of output signals OS may be provided via a plurality of output pads (or pins). One input signal received via one input pad may be transmitted via one through-electrode, and may be provided as one output signal via one output pad. When a failure or defect occurs on a specific through-electrode, a signal to be transmitted to a defective through-electrode may be transmitted to a redundant through-electrode or another through-electrode by the router circuits 200a and 200b (e.g., by the input router circuit 200a). For example, a pad may be a contact pad or a contact pin, however example embodiments are not limited thereto.

In some example embodiments, as will be described with reference to FIG. 7, the router circuits 200a and 200b may include a plurality of multiplexers that are connected to the plurality of through-electrodes 400, and a plurality of redundant multiplexers that are connected to the plurality of redundant through-electrodes 500. For example, one multiplexer may be connected to one through-electrode, and one redundant multiplexer may be connected to one redundant through-electrode. That is, the multiplexers and through-electrodes may respectively correspond to one another and the redundant multiplexers and redundant through-electrodes may respectively correspond to one another.

As described with reference to FIG. 1, the plurality of through-electrodes 400 may be grouped into a plurality of through-electrode groups STE_G1, . . . , STE_GM, and the plurality of redundant through-electrodes 500 may be grouped into a plurality of redundant through-electrode groups RTE_G1, . . . , RTE_Gm. The plurality of through-electrode groups STE_G1 to STE_GM may be formed in a circular structure, and each of the plurality of through-electrode groups STE_G1 to STE_GM may include two or more through-electrodes. Each of the plurality of redundant through-electrode groups RTE_G1 to RTE_Gm may include at least one redundant through-electrode and may correspond to at least one through-electrode group. The plurality of multiplexers and the plurality of redundant multiplexers may be implemented and connected corresponding to the above-described grouping.

The path search circuit 300 may be configured to control the router circuits 200a and 200b, and may be configured to search for repair paths for the plurality of through-electrodes 400. The path search circuit 300 may be configured to generate control signals CON for controlling the router circuits 200a and 200b. For example, the control signals CON may be provided to the plurality of multiplexers and the plurality of redundant multiplexers, and may be used for signal selection.

The path search circuit 300 may be configured to perform the method of repairing the through-electrodes according to example embodiments described with reference to FIGS. 1 and 2. The path search circuit 300 may be configured to perform the operations of block S300 in FIG. 1 and the operations of the blocks of FIG. 2. For example, the path search circuit 300 may be configured to search the repair paths by determining whether the y-th redundant through-electrode included in the x-th redundant through-electrode group corresponding to the X-th through-electrode group is available for performing signal transmission thereto when the Y-th through-electrode included in the X-th through-electrode group is a defective through-electrode or when the signal is received from the (X−1)-th through-electrode group, by transmitting the signal input to the Y-th through-electrode to the y-th redundant through-electrode when the y-th redundant through-electrode is available for performing signal transmission thereto, and by transmitting the signal input to the Y-th through-electrode to the (X+1)-th through-electrode group when the y-th redundant through-electrode is unavailable for performing signal transmission thereto. For example, the path search circuit 300 may be configured to perform the operations of the blocks of FIG. 2 by setting Y=1 at an initial operation time, and may repeatedly perform the operations of FIG. 2 while increasing Y by one.

In some example embodiments, the path search circuit 300 may be configured to operate based on a clock signal that is periodically toggled. For example, a repair path search for one through-electrode may be performed per one clock cycle of the clock signal. In other words, operations of FIG. 2 performed on the Y-th through-electrode may be completed within one clock cycle. If the repair paths are searched for all through-electrodes starting from the defective through-electrode, a path to any redundant through-electrode may be searched. Even in the worst case, the repair path search may not be performed more than three times for the same through-electrode. Thus, when the number of the plurality of through-electrodes 400 is N, the entire repair process may be completed within 2N clock cycles.

In some example embodiments, at least a part of the path search circuit 300 may be implemented as hardware. For example, at least a part of the path search circuit 300 may be included in a computer-based electronic system. In other example embodiments, at least a part of the path search circuit 300 may be implemented as computer readable program code (e.g., a software program). For example, instruction codes or program routines may be executed by a computer-based electronic system, and the computer readable program code may be stored in any storage device located inside or outside the computer-based electronic system.

Although not illustrated in FIG. 3, the repair device 100 may further include a structure, such as a queue and/or a ring buffer. In this example, the repair device 100 may be configured to perform the repair path search only for the defective through-electrode and the through-electrode may receive the signal from the previous through-electrode group using the queue and/or the ring buffer, instead of performing the repair path search for all of the through-electrodes, FIG. 4 is a cross-sectional view of an example of through-electrodes that are a target of a repair operation performed according to example embodiments.

Figure 4:
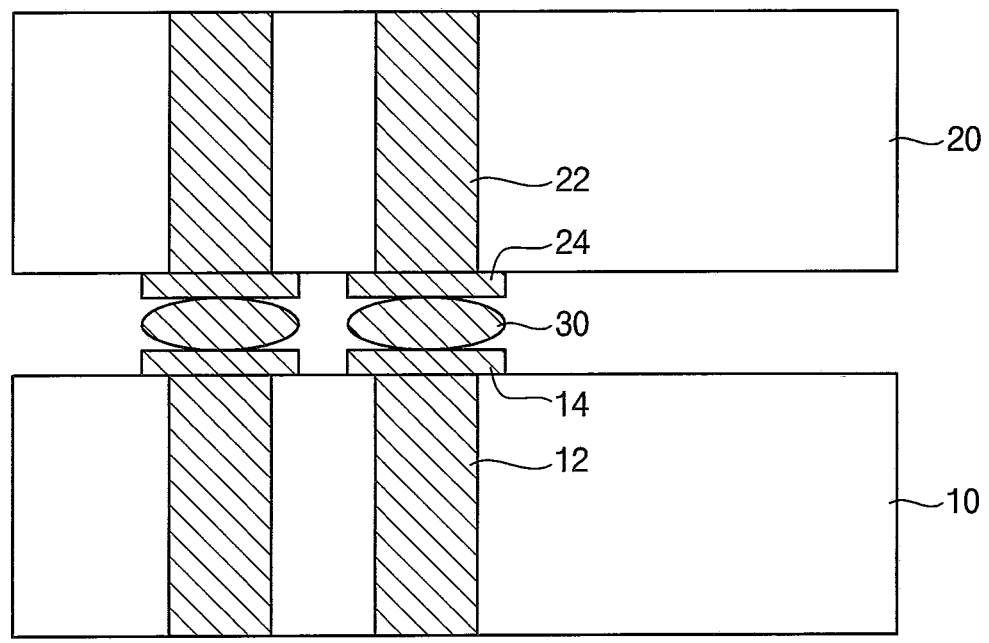
FIG. 4 is a cross-sectional view of an example of through-electrodes that are a target of a repair operation performed according to example embodiments.

Referring to FIG. 4, a first semiconductor substrate 10 and a second semiconductor substrate 20, which are stacked in a vertical direction may be provided. For example, the second semiconductor substrate 20 may be disposed on the first semiconductor substrate 10. For example, each of the first semiconductor substrate 10 and the second semiconductor substrate 20 may be provided to form one semiconductor chip.

A first through-electrode 12 penetrating the first semiconductor substrate 10 may be formed. A first pad 14 may be formed on the first through-electrode 12. For example, the first pad 14 may be formed on one surface of the first semiconductor substrate 10 adjacent to the second semiconductor substrate 20.

A second through-electrode 22 penetrating the second semiconductor substrate 20 may be formed. A second pad 24 may be formed on the second through-electrode 22. For example, the second pad 24 may be formed on one surface of the second semiconductor substrate 20 adjacent to the first semiconductor substrate 10.

An electrical connection structure 30 may be formed between the first pad 14 and the second pad 24. The first semiconductor substrate 10 and the second semiconductor substrate 20 may be electrically connected by the first and second through-electrodes 12 and 22, the first and second pads 14 and 24, and the electrical connection structure 30. For example, the electrical connection structure 30 may be formed of a conductive material, such as solder, or may include a land, a ball, a pin, and/or the like.

During a manufacturing process, production or use of a semiconductor device including the semiconductor substrates 10 and 20 illustrated in FIG. 4, defects or failures may occur on the first and second through-electrodes 12 and 22. Thus, an extra through-electrode (e.g., redundant through-electrode) may be provided in addition to the first and second through-electrodes 12 and 22, and the defective first and second through-electrodes 12 and 22 may be replaced with the redundant through-electrode.

In some example embodiments, the semiconductor substrates 10 and 20 may be silicon substrates, and the through-electrodes 12 and 22 may be through-silicon vias (TSVs) penetrating the silicon substrates. In this example, the plurality of through-electrodes 400 in FIG. 3 may be referred to as signal TSVs (STSVs), the plurality of redundant through-electrodes 500 in FIG. 3 may be referred to as redundant TSVs (RTSVs), and the defective through-electrode may be referred to as a failure TSV (FTSV).

Figure 6:
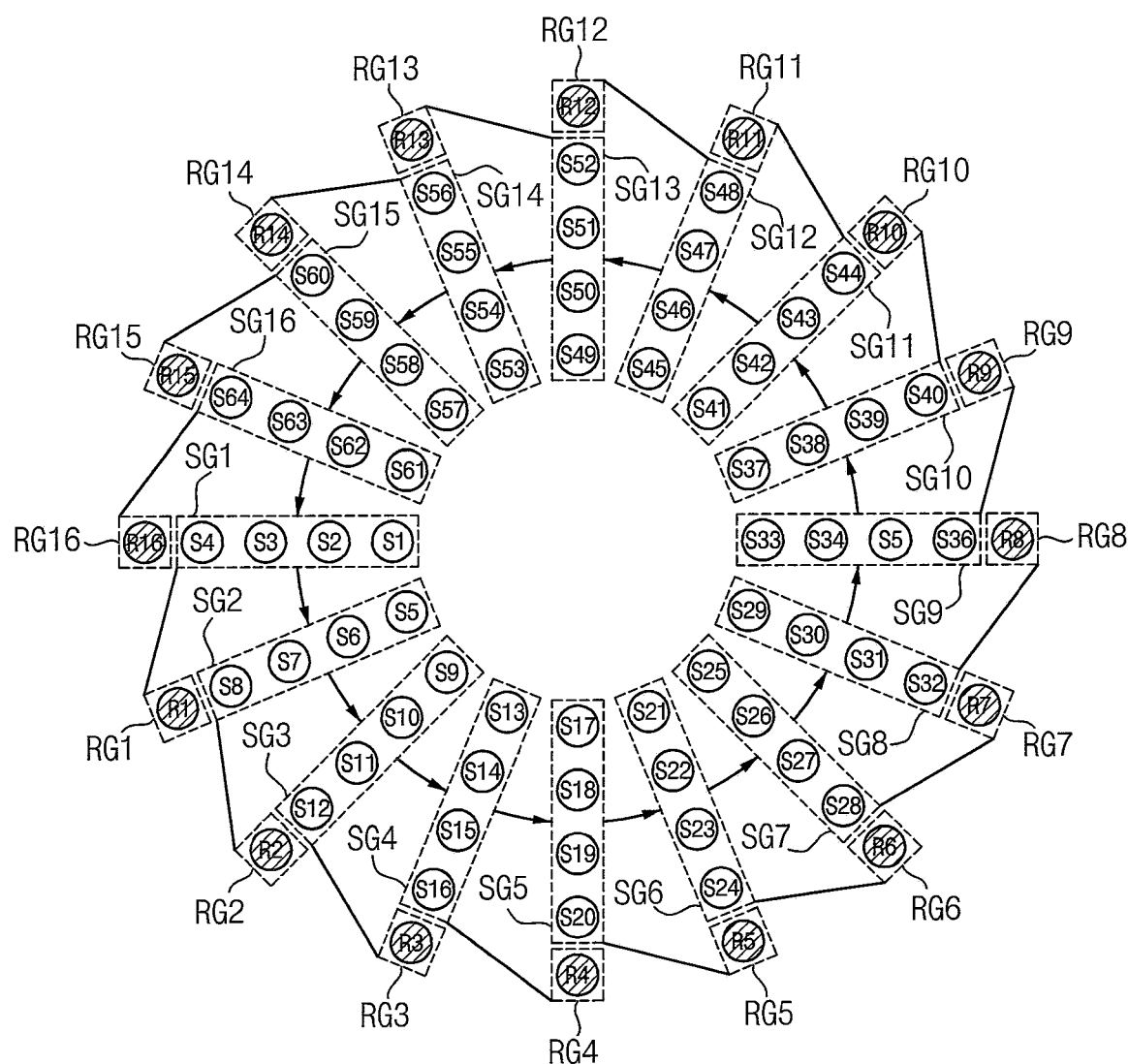

FIGS. 5 and 6 are diagrams illustrating examples of grouping through-electrodes and redundant through-electrodes for a repair operation performed according to example embodiments.

Referring to FIG. 5, an example of grouping the through-electrodes and the redundant through-electrodes is illustrated in a plan view. In an example of FIG. 5, the number of through-electrodes STE may be sixty four, the number of redundant through-electrodes RTE may be sixteen, the number of through-electrode groups and the number of redundant through-electrode groups may be equal to each other and may be sixteen, four through-electrodes may be included in one through-electrode group, and one redundant through-electrode may be included in one redundant through-electrode group (e.g., N=64, M=16, K=4, n=16, m=16, k=1).

A first through-electrode group SG1 may include first, second, third and fourth through-electrodes S1, S2, S3 and S4. A second through-electrode group SG2 may include fifth, sixth, seventh and eighth through-electrodes S5, S6, S7 and S8. A third through-electrode group SG3 may include ninth, tenth, eleventh and twelfth through-electrodes S9, S10, S11 and S12. A fourth through-electrode group SG4 may include thirteenth, fourteenth, fifteenth and sixteenth through-electrodes S13, S14, S15 and S16. A fifth through-electrode group SG5 may include seventeenth, eighteenth, nineteenth and twentieth through-electrodes S17, S18, S19 and S20. A sixth through-electrode group SG6 may include twenty-first, twenty-second, twenty-third and twenty-fourth through-electrodes S21, S22, S23 and S24. A seventh through-electrode group SG7 may include twenty-fifth, twenty-sixth, twenty-seventh and twenty-eighth through-electrodes S25, S26, S27 and S28. An eighth through-electrode group SG8 may include twenty-ninth, thirtieth, thirty-first and thirty-second through-electrodes S29, S30, S31 and S32. A ninth through-electrode group SG9 may include thirty-third, thirty-fourth, thirty-fifth and thirty-sixth through-electrodes S33, S34, S35 and S36. A tenth through-electrode group SG10 may include thirty-seventh, thirty-eighth, thirty-ninth and fortieth through-electrodes S37, S38, S39 and S40. An eleventh through-electrode group SG11 may include forty-first, forty-second, forty-third and forty-fourth through-electrodes S41, S42, S43 and S44. A twelfth through-electrode group SG12 may include forty-fifth, forty-sixth, forty-seventh and forty-eighth through-electrodes S45, S46, S47 and S48. A thirteenth through-electrode group SG13 may include forty-ninth, fiftieth, fifty-first and fifty-second through-electrodes S49, S50, S51 and S52. A fourteenth through-electrode group SG14 may include fifty-third, fifty-fourth, fifty-fifth and fifty-sixth through-electrodes S53, S54, S55 and S56. A fifteenth through-electrode group SG15 may include fifty-seventh, fifty-eighth, fifty-ninth and sixtieth through-electrodes S57, S58, S59 and S60. A sixteenth through-electrode group SG16 may include sixty-first, sixty-second, sixty-third and sixty-fourth through-electrodes S61, S62, S63 and S64.

The first to sixteenth through-electrode groups SG1 to SG16 may be formed and/or implemented in a circular structure. For example, the first through-electrode group SG1 may be configured to transmit a signal to the second through-electrode group SG2. The second through-electrode group SG2 may be configured to transmit a signal to the third through-electrode group SG3. The third through-electrode group SG3 may be configured to transmit a signal to the fourth through-electrode group SG4. The fourth through-electrode group SG4 may be configured to transmit a signal to the fifth through-electrode group SG5. The fifth through-electrode group SG5 may be configured to transmit a signal to the sixth through-electrode group SG6. The sixth through-electrode group SG6 may be configured to transmit a signal to the seventh through-electrode group SG7. The seventh through-electrode group SG7 may be configured to transmit a signal to the eighth through-electrode group SG8. The eighth through-electrode group SG8 may be configured to transmit a signal to the ninth through-electrode group SG9. The ninth through-electrode group SG9 may be configured to transmit a signal to the tenth through-electrode group SG10. The tenth through-electrode group SG10 may be configured to transmit a signal to the eleventh through-electrode group SG11. The eleventh through-electrode group SG11 may be configured to transmit a signal to the twelfth through-electrode group SG12. The twelfth through-electrode group SG12 may be configured to transmit a signal to the thirteenth through-electrode group SG13. The thirteenth through-electrode group SG13 may be configured to transmit a signal to the fourteenth through-electrode group SG14. The fourteenth through-electrode group SG14 may be configured to transmit a signal to the fifteenth through-electrode group SG15. The fifteenth through-electrode group SG15 may be configured to transmit a signal to the sixteenth through-electrode group SG16. The sixteenth through-electrode group SG16 may be configured to transmit a signal to the first through-electrode group SG1. Signal transmission directions of the through-electrode groups SG1 to SG16 based on the circular structure are illustrated by solid arrows.

A first redundant through-electrode group RG1 may correspond to the first through-electrode group SG1, and may include a first redundant through-electrode R1. A second redundant through-electrode group RG2 may correspond to the second through-electrode group SG2, and may include a second redundant through-electrode R2. A third redundant through-electrode group RG3 may correspond to the third through-electrode group SG3, and may include a third redundant through-electrode R3. A fourth redundant through-electrode group RG4 may correspond to the fourth through-electrode group SG4, and may include a fourth redundant through-electrode R4. A fifth redundant through-electrode group RG5 may correspond to the fifth through-electrode group SG5, and may include a fifth redundant through-electrode R5. A sixth redundant through-electrode group RG6 may correspond to the sixth through-electrode group SG6, and may include a sixth redundant through-electrode R6. A seventh redundant through-electrode group RG7 may correspond to the seventh through-electrode group SG7, and may include a seventh redundant through-electrode R7. An eighth redundant through-electrode group RG8 may correspond to the eighth through-electrode group SG8, and may include an eighth redundant through-electrode group R8. A ninth redundant through-electrode group RG9 may correspond to the ninth through-electrode group SG9, and may include a ninth redundant through-electrode R9. A tenth redundant through-electrode group RG10 may correspond to the tenth through-electrode group SG10, and may include a tenth redundant through-electrode R10. An eleventh redundant through-electrode group RG11 may correspond to the eleventh through-electrode group SG11, and may include an eleventh redundant through-electrode R11. A twelfth redundant through-electrode group RG12 may correspond to the twelfth through-electrode group SG12, and may include a twelfth redundant through-electrode R12. A thirteenth redundant through-electrode group RG13 may correspond to the thirteenth through-electrode group SG13, and may include a thirteenth redundant through-electrode R13. A fourteenth redundant through-electrode group RG14 may correspond to the fourteenth through-electrode group SG14, and may include a fourteenth redundant through-electrode R14. A fifteenth redundant through-electrode group RG15 may correspond to the fifteenth through-electrode group SG15, and may include a fifteenth redundant through-electrode R15. A sixteenth redundant through-electrode group RG16 may correspond to the sixteenth through-electrode group SG16, and may include a sixteenth redundant through-electrode R16. Correspondences between the through-electrode groups SG1 to SG16 and the redundant through-electrode groups RG1 to RG16 are illustrated by solid lines.

Referring to FIG. 6, an example of FIG. 6 may be substantially the same as the example of FIG. 5, except that the through-electrode groups SG1 to SG16 and the redundant through-electrode groups RG1 to RG16 are arranged in a ring shape (e.g., arranged along an imaginary circle).

Figure 7:
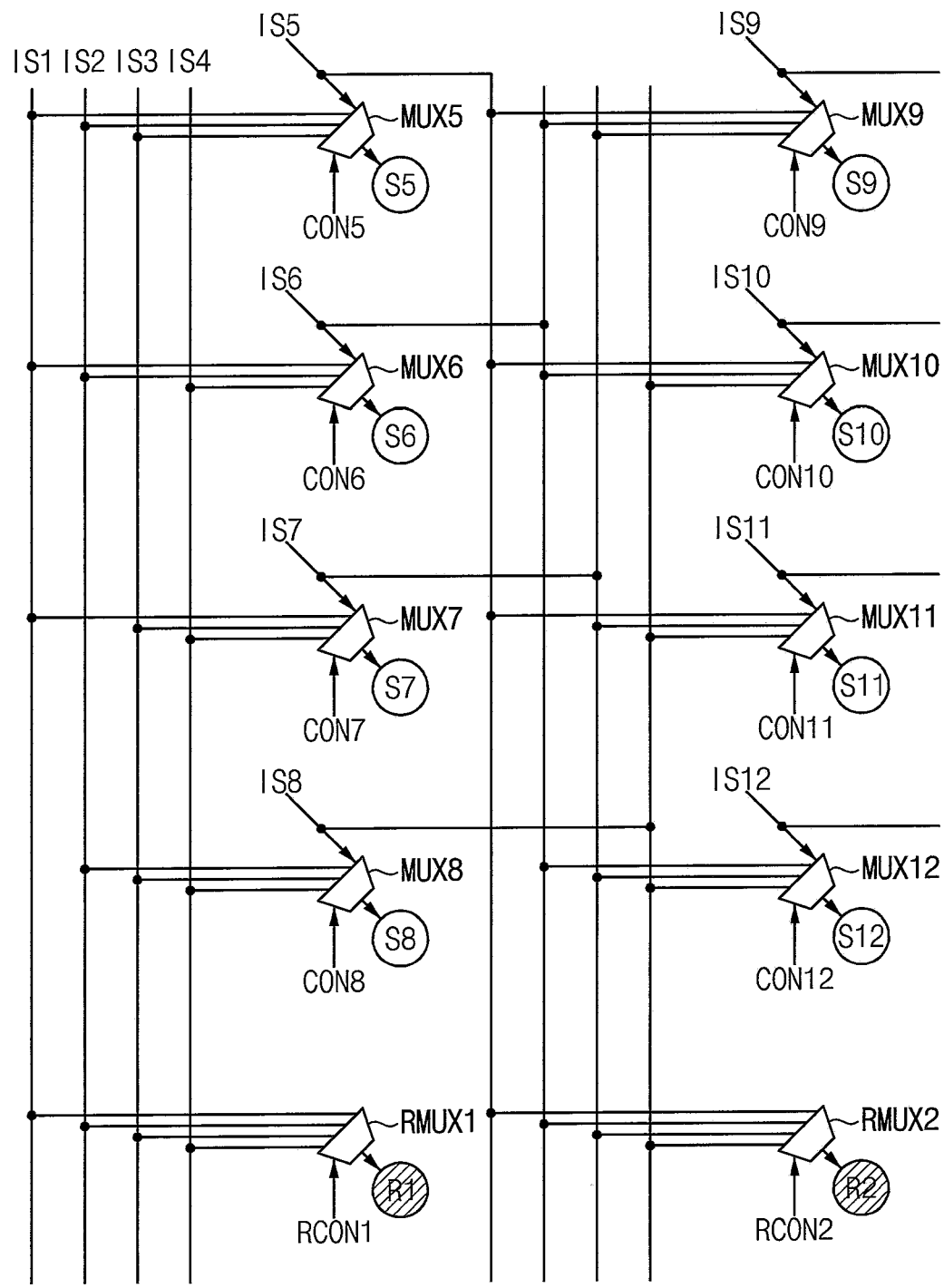
FIG. 7 is a block diagram illustrating an example of a router circuit included in a repair device according to example embodiments.

FIG. 7 is a block diagram illustrating an example of a router circuit included in a repair device according to example embodiments.

Referring to FIG. 7, a router circuit may include a plurality of multiplexers MUX5, MUX6, MUX7, MUX8, MUX9, MUX10, MUX11 and MUX12, and a plurality of redundant multiplexers RMUX1 and RMUX2. For convenience of illustration, only the multiplexers MUX5 to MUX12 connected to some through-electrodes S5 to S12 in FIGS. 5 and 6 are illustrated, and only the redundant multiplexers RMUX1 and RMUX2 connected to some redundant through-electrodes R1 and R2 are illustrated.

In some example embodiments, each of the multiplexers MUX5 to MUX12 and the redundant multiplexers RMUX1 and RMUX2 may be a 4:1 multiplexer, because four through-electrodes are included in one through electrode group in the example of FIGS. 5 and 6. However, example embodiments are not limited thereto.

In some example embodiments, the multiplexers MUX5 to MUX12 and the redundant multiplexers RMUX1 and RMUX2 may be included in the input router circuit 200a.

The fifth multiplexer MUX5 may be connected to the fifth through-electrode S5 included in the second through-electrode group SG2. Based on a fifth control signal CON5, the fifth multiplexer MUX5 may be configured to select one of a signal received from the first through-electrode group SG1 that is the previous through-electrode group and a fifth input signal IS5 input to the fifth through-electrode S5, and may be configured to provide the selected signal to the fifth through-electrode S5. Although not illustrated in detail, first, second, third and fourth input signals IS1, IS2, IS3 and IS4 may be input to the first, second, third and fourth through-electrodes SG1 included in the first through electrode group SG1, respectively, and the fifth multiplexer MUX5 may be configured to receive one of the first, second and third input signals IS1, IS2 and IS3 from the first through-electrode group SG1.

The sixth multiplexer MUX6 may be connected to the sixth through-electrode S6 included in the second through-electrode group SG2. Based on a sixth control signal CON6, the sixth multiplexer MUX6 may be configured to select one of a signal received from the first through-electrode group SG1 and a sixth input signal IS6 input to the sixth through-electrode S6, and may be configured to provide the selected signal to the sixth through-electrode S6. The sixth multiplexer MUX6 may be configured to receive one of the first, second and fourth input signals IS1, IS2 and IS4 from the first through-electrode group SG1.

The seventh multiplexer MUX7 may be connected to the seventh through-electrode S7 included in the second through-electrode group SG2. Based on a seventh control signal CON7, the seventh multiplexer MUX7 may be configured to select one of a signal received from the first through-electrode group SG1 and a seventh input signal IS7 input to the seventh through-electrode S7, and may be configured to provide the selected signal to the seventh through-electrode S7. The seventh multiplexer MUX7 may be configured to receive one of the first, third and fourth input signals IS1, IS3 and IS4 from the first through-electrode group SG1.

The eighth multiplexer MUX8 may be connected to the eighth through-electrode S8 included in the second through-electrode group SG2. Based on an eighth control signal CON8, the eighth multiplexer MUX8 may be configured to select one of a signal received from the first through-electrode group SG1 and an eighth input signal IS8 input to the eighth through-electrode S8, and may be configured to provide the selected signal to the eighth through-electrode S8. The eighth multiplexer MUX8 may be configured to receive one of the second, third and fourth input signals IS2, IS3 and IS4 from the first through-electrode group SG1.

Configurations of the multiplexers MUX9 to MUX12 may be similar to those of the multiplexers MUX5 to MUX8.

The ninth multiplexer MUX9 may be connected to the ninth through-electrode S9 included in the third through-electrode group SG3. Based on a ninth control signal CON9, the ninth multiplexer MUX9 may be configured to select one of a signal (e.g., the fifth input signal IS5, the sixth input signal IS6 or the seventh input signal IS7) received from the second through-electrode group SG2 and a ninth input signal IS9 input to the ninth through-electrode S9, and may be configured to provide the selected signal to the ninth through-electrode S9.

The tenth multiplexer MUX10 may be connected to the tenth through-electrode S10 included in the third through-electrode group SG3. Based on a tenth control signal CON10, the tenth multiplexer MUX10 may be configured to select one of a signal (e.g., the fifth input signal IS5, the sixth input signal IS6 or the eighth input signal IS8) received from the second through-electrode group SG2 and a tenth input signal IS10 input to the tenth through-electrode S10, and may be configured to provide the selected signal to the tenth through-electrode S10.

The eleventh multiplexer MUX11 may be connected to the eleventh through-electrode S11 included in the third through-electrode group SG3. Based on an eleventh control signal CON11, the eleventh multiplexer MUX11 may be configured to select one of a signal (e.g., the fifth input signal IS5, the seventh input signal IS7 or the eighth input signal IS8) received from the second through-electrode group SG2 and an eleventh input signal IS11 input to the eleventh through-electrode S11, and may be configured to provide the selected signal to the eleventh through-electrode S11.

The twelfth multiplexer MUX12 may be connected to the twelfth through-electrode S12 included in the third through-electrode group SG3. Based on a twelfth control signal CON12, the twelfth multiplexer MUX12 may be configured to select one of a signal (e.g., the sixth input signal IS6, the seventh input signal IS7 or the eighth input signal IS8) received from the second through-electrode group SG2 and a twelfth input signal IS12 input to the twelfth through-electrode S12, and may be configured to provide the selected signal to the twelfth through-electrode S12.

In some example embodiments, when the fifth multiplexer MUX5 selects the signal (e.g., the first input signal IS1, the second input signal IS2 or the third input signal IS3) received from the first through-electrode group SG1 and provides the received signal to the fifth through-electrode S5, the fifth input signal IS5 input to the fifth through-electrode S5 may be transmitted to the third through-electrode group SG3, which is the next through-electrode group. For example, the fifth input signal IS5 may be transmitted to one of the multiplexers MUX9, MUX10 and MUX11 connected to the through-electrodes S9, S10 and S11 included in the third through-electrode group SG3. For example, among the multiplexers MUX9, MUX10 and MUX11, the fifth input signal IS5 may be transmitted to a multiplexer connected to a through-electrode on which the path search is performed first.

Similarly, when the sixth multiplexer MUX6 selects the signal (e.g., the first input signal IS1, the second input signal IS2 or the fourth input signal IS4) received from the first through-electrode group SG1 and provides the received signal to the sixth through-electrode S6, the sixth input signal IS6 input to the sixth through-electrode S6 may be transmitted to the third through-electrode group SG3 (e.g., to one of the multiplexers MUX9, MUX10 and MUX12 connected to the through-electrodes S9, S10 and S12). When the seventh multiplexer MUX7 selects the signal (e.g., the first input signal IS1, the third input signal IS3 or the fourth input signal IS4) received from the first through-electrode group SG1 and provides the received signal to the seventh through-electrode S7, the seventh input signal IS7 input to the seventh through-electrode S7 may be transmitted to the third through-electrode group SG3 (e.g., to one of the multiplexers MUX9, MUX11 and MUX12 connected to the through-electrodes S9, S11 and S12). When the eighth multiplexer MUX8 selects the signal (e.g., the second input signal IS2, the third input signal IS3 or the fourth input signal IS4) received from the first through-electrode group SG1 and provides the received signal to the eighth through-electrode S8, the eighth input signal IS8 input to the eighth through-electrode S8 may be transmitted to the third through-electrode group SG3 (e.g., to one of the multiplexers MUX10, MUX11 and MUX12 connected to the through-electrodes S10, S11 and S12).

The first redundant multiplexer RMUX1 may be connected to the first redundant through-electrode R1 included in the first redundant through-electrode group RG1. Based on a first redundant control signal RCON1, the first redundant multiplexer RMUX1 may be configured to select one of the signals IS1 to IS4 input to the through-electrodes S1 to S4 included in the first through-electrode group SG1, and may be configured to provide the selected signal to the first redundant through-electrode R1. The second redundant multiplexer RMUX2 may be connected to the second redundant through-electrode R2 included in the second redundant through-electrode group RG2. Based on a second redundant control signal RCON2, the second redundant multiplexer RMUX2 may be configured to select one of the signals IS5 to IS8 input to the through-electrodes S5 to S8 included in the second through-electrode group SG2, and may be configured to provide the selected signal to the second redundant through-electrode R2.

In summary, each through-electrode may be connected to the multiplexer included in the router circuit. Each multiplexer may be connected to a signal received from the previous through-electrode group and a signal intended to be originally sent to the present through-electrode. If the repair operation is not required, the signal intended to be originally sent to the present through-electrode may be provided to the present through-electrode as it is. If the repair operation is required, the multiplexer may be controlled by the path search circuit 300, and thus another signal (e.g., the signal received from the previous through-electrode group), rather than the signal intended to be originally sent to the present through-electrode, may be provided to the present through-electrode, and the signal received from the previous through-electrode group may flow via the present through-electrode. In addition, each redundant through-electrode may be connected to the redundant multiplexer included in the router circuit. Each redundant multiplexer may be connected to signals from the present through-electrode group. If a signal to be input to the defective through-electrode is directly sent to the redundant through-electrode, the repair path search may be completed. If the signal to be input to the defective through-electrode is sent to another through-electrode rather than the redundant through-electrode, a path of the signal intended to be originally sent to the present through-electrode may be modified or adjusted such that the signal intended to be originally sent to the present through-electrode is provided to still another through-electrode, thereby preventing the signal collision. Such process may continue and/or may be repeated until the signal is finally sent to the redundant through-electrode. If there are many (e.g., two or more) defective through-electrodes, such process may be performed for each defective through-electrode.

Although FIG. 7 illustrates only some multiplexers MUX5 to MUX12 and some redundant multiplexers RMUX1 and RMUX2 included in the router circuit, example embodiments are not limited thereto. For example, one multiplexer may be connected to one through-electrode and one redundant multiplexer may be connected to one redundant through-electrode on a one-to-one basis, as described above. Thus, the router circuit may include a plurality of multiplexers and a plurality of redundant multiplexers, the number of multiplexers in the router circuit may be equal to the number of through-electrodes S1 to S64, and the number of redundant multiplexers in the router circuit may be equal to the number of redundant through-electrodes R1 to R16. The multiplexers connected to the remaining through-electrodes S1 to S4 and S13 to S64 other than the through-electrodes S5 to S12 and the redundant multiplexers connected to the remaining redundant through-electrodes R3 to R16 other than the redundant through-electrodes R1 and R2 may be implemented similarly to those illustrated in FIG. 7.

Figure 8:
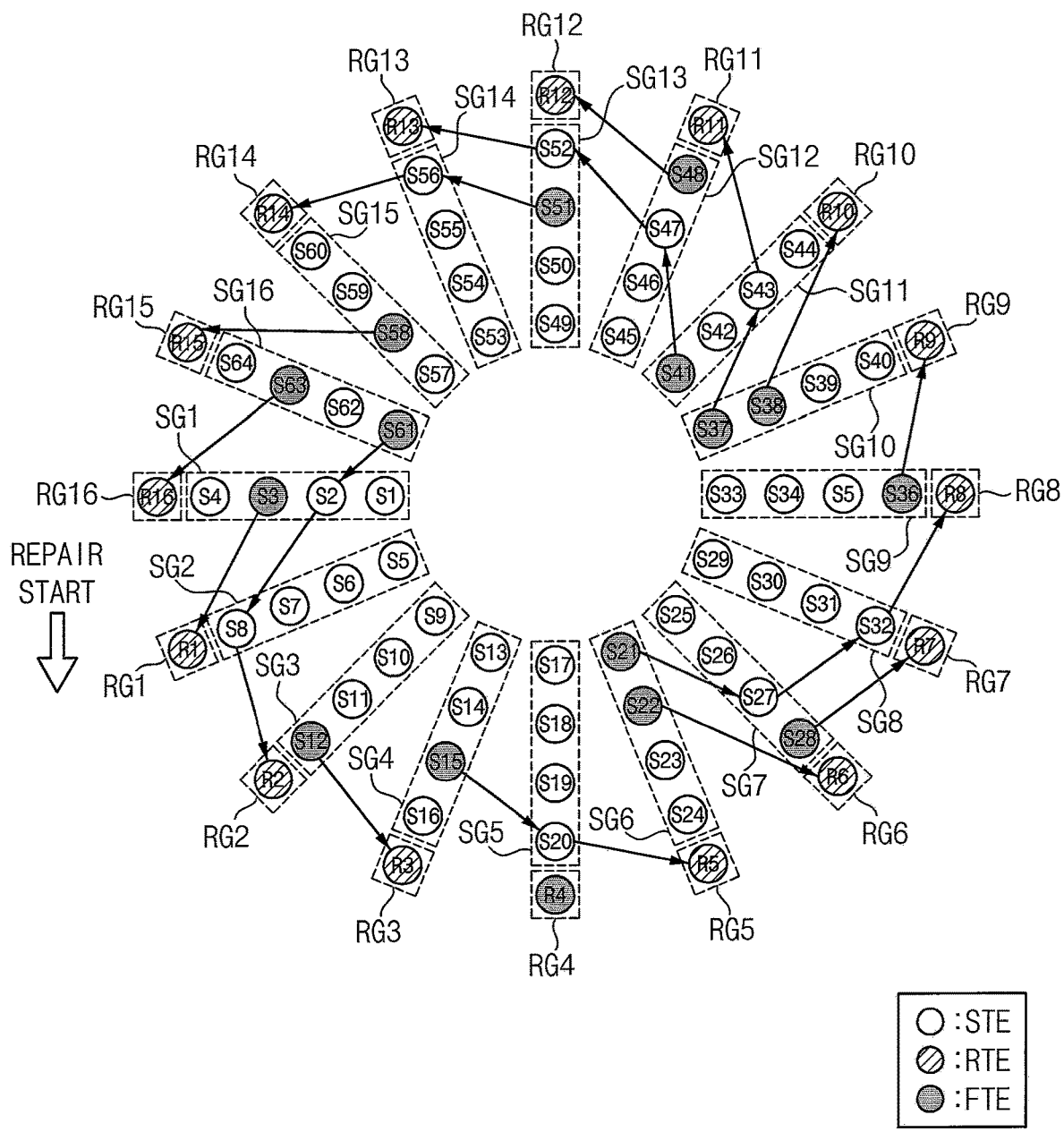
FIG. 8 is a diagram illustrating an example of a result of performing a method of repairing through-electrodes according to example embodiments.

FIG. 8 is a diagram illustrating an example of a result of performing a method of repairing through-electrodes according to example embodiments.

Referring to FIG. 8, an example of a result of performing the method of repairing the through-electrodes according to example embodiments is illustrated in a plan view. In an example of FIG. 8, the through-electrodes S1 to S64, the through-electrode groups SG1 to SG16, the redundant through-electrodes R1 to R16 and the redundant through-electrode groups RG1 to RG16 may be implemented as illustrated in FIG. 6, the router circuit may be implemented as illustrated in FIG. 7, and some through-electrodes S3, S12, S15, S21, S22, S28, S36, S37, S38, S41, S48, S51, S58, S61 and S63 and the redundant through-electrode R4 may be determined as defective through-electrodes FTE to perform the repair operation.

The repair path search may be sequentially performed from the first through-electrode S1 included in the first through-electrode group SG1 until all of the defective through-electrodes FTE are repaired.

In the first through-electrode group SG1, the third through-electrode S3 may be the defective through-electrode FTE, and thus the third through-electrode S3 may be repaired with the first redundant through-electrode R1 included in the first redundant through-electrode group RG1. For example, the third input signal IS3 input to the third through-electrode S3 may be transmitted to the first redundant through-electrode R1 by the first redundant multiplexer RMUX1 connected to the first redundant through-electrode R1.

In the second through-electrode group SG2, the repair operation may not be performed because there is no the defective through-electrode FTE.

In the third through-electrode group SG3, the twelfth through-electrode S12 may be the defective through-electrode FTE, and thus the twelfth through-electrode S12 may be repaired with the third redundant through-electrode R3 included in the third redundant through-electrode group RG3.

In the fourth through-electrode group SG4, the fifteenth through-electrode S15 may be the defective through-electrode FTE, and the fourth redundant through-electrode R4 included in the fourth redundant through-electrode group RG4 may also be a defective through electrode FTE. Thus, the fifteenth through-electrode S15 may not be repaired with the fourth redundant through-electrode R4, and a signal (e.g., a fifteenth input signal) input to the fifteenth through-electrode S15 may be transmitted to the twentieth through-electrode S20 included in the fifth through-electrode group SG5 by a twentieth multiplexer connected to the twentieth through-electrode S20.

In the fifth through-electrode group SG5, there is no the defective through-electrode FTE, and the twentieth through-electrode S20 may receive the signal (e.g., the fifteenth input signal input to the fifteenth through-electrode S15) from the fourth through-electrode group SG4. Thus, the twentieth through-electrode S20 may be repaired with the fifth redundant through-electrode R5 included in the fifth redundant through-electrode group RG5.

In the sixth through-electrode group SG6, the twenty-first and the twenty-second through-electrodes S21 and S22 may be the defective through-electrodes FTE, and thus one of the through-electrodes S21 and S22 may be repaired. For example, the twenty-second through-electrode S22 may be repaired with the sixth redundant through-electrode R6 included in the sixth redundant through-electrode group RG6. Because the sixth redundant through-electrode R6 is already used for repairing the twenty-second through-electrode S22, a signal (e.g., a twenty-first input signal) input to the twenty-first through-electrode S21 may be transmitted to the twenty-seventh through-electrode S27 included in the seventh through-electrode group SG7 by a twenty-seventh multiplexer connected to the twenty-seventh through-electrode S27.

In the seventh through-electrode group SG7, the twenty-eighth through-electrode S28 may be the defective through-electrode FTE, the twenty-seventh through-electrode S27 may receive the signal (e.g., the twenty-first input signal input to the twenty-first through-electrode S21) from the sixth through-electrode group SG6, and thus one of the through-electrodes S27 and S28 may be repaired. For example, the twenty-eighth through-electrode S28 may be repaired with the seventh redundant through-electrode R7 included in the seventh redundant through-electrode group RG7. Because the seventh redundant through-electrode R7 is already used for repairing the twenty-eighth through-electrode S28, a signal (e.g., a twenty-seventh input signal) input to the twenty-seventh through-electrode S27 may be transmitted to the thirty-second through-electrode S32 included in the eighth through-electrode group SG8 by a thirty-second multiplexer connected to the thirty-second through-electrode S32.

In the eighth through-electrode group SG8, there is no the defective through-electrode FTE, and the thirty-second through-electrode S32 receives the signal (e.g., the twenty-seventh input signal input to the twenty-seventh through-electrode S27) from the seventh through-electrode group SG7. Thus, the thirty-second through-electrode S32 may be repaired with the eighth redundant through-electrode R8 included in the eighth redundant through-electrode group RG8.

In the ninth through-electrode group SG9, the thirty-sixth through-electrode S36 may be the defective through-electrode FTE, and thus the thirty-sixth through-electrode S36 may be repaired with the ninth redundant through-electrode R9 included in the ninth redundant through-electrode group RG9.

In the tenth through-electrode group SG10, the thirty-seventh and the thirty-eighth through-electrodes S37 and S38 may be the defective through-electrodes FTE, and thus one of the through-electrodes S37 and S38 may be repaired. For example, the thirty-eighth through-electrode S38 may be repaired with the tenth redundant through-electrode R10 included in the tenth redundant through-electrode group RG10. Because the tenth redundant through-electrode R10 is already used for repairing the thirty-eighth through-electrode S38, a signal (e.g., a thirty-seventh input signal) input to the thirty-seventh through-electrode S37 may be transmitted to the forty-third through-electrode S43 included in the eleventh through-electrode group SG11 by a forty-third multiplexer connected to the forty-third through-electrode S43.

In the eleventh through-electrode group SG11, the forty-third through-electrode S43 may receive the signal (e.g., the thirty-seventh input signal input to the thirty-seventh through-electrode S37) from the tenth through-electrode group SG10, the forty-first through-electrode S41 may be the defective through electrode FTE, and thus one of the through-electrodes S41 and S43 may be repaired. For example, the forty-third through-electrode S43 may be repaired with the eleventh redundant through-electrode R11 included in the eleventh redundant through-electrode group RG11. Because the eleventh redundant through-electrode R11 is already used for repairing the forty-third through-electrode S43, a signal (e.g., a forty-first input signal) input to the forty-first through-electrode S41 may be transmitted to the forty-seventh through-electrode S47 included in the twelfth through-electrode group SG12 by a forty-seventh multiplexer connected to the forty-seventh through-electrode S47.

In the twelfth through-electrode group SG12, the forty-eighth through-electrode S48 may be the defective through-electrode FTE, the forty-seventh through-electrode S47 may receive the signal (e.g., the forty-first input signal input to the forty-first through-electrode S41) from the eleventh through-electrode group SG11, and thus one of the through-electrodes S47 and S48 may be repaired. For example, the forty-eighth through-electrode S48 may be repaired with the twelfth redundant through-electrode R12 included in the twelfth redundant through-electrode group RG12. Because the twelfth redundant through-electrode R12 is already used for repairing the forty-eighth through-electrode S48, a signal (e.g., a forty-seventh input signal) input to the forty-seventh through-electrode S47 may be transmitted to the fifty-second through-electrode S52 included in the thirteenth through-electrode group SG13 through a fifty-second multiplexer connected to the fifty-second through-electrode S52.

In the thirteenth through-electrode group SG13, the fifty-second through-electrode S52 may receive the signal (e.g., the forty-seventh input signal input to the forty-seventh through-electrode S47) from the twelfth through-electrode group SG12, the fifty-first through-electrode S51 may be the defective through-electrode FTE, and thus one of the through-electrodes S51 and S52 may be repaired. For example, the fifty-second through-electrode S52 may be repaired with the thirteenth redundant through-electrode R13 included in the thirteenth redundant through-electrode group RG13. Because the thirteenth redundant through-electrode R13 is already used for repairing the fifty-second through-electrode S52, a signal (e.g., a fifty-first input signal) input to the fifty-first through-electrode S51 may be transmitted to the fifty-sixth through-electrode S56 included in the fourteenth through-electrode group SG14 by a fifty-sixth multiplexer connected to the fifty-sixth through-electrode S56.

In the fourteenth through-electrode group SG14, there is no the defective through-electrode FTE, and the fifty-sixth through-electrode S56 may receive the signal (e.g., the fifty-first input signal input to the fifty-first through-electrode S51) from the thirteenth through-electrode group SG13. Thus, the fifty-sixth through-electrode S56 may be repaired with the fourteenth redundant through-electrode R14 included in the fourteenth redundant through-electrode group RG14.

In the fifteenth through-electrode group SG15, the fifty-eighth through-electrode S58 may be the defective through-electrode FTE, and thus the fifty-eighth through-electrode S58 may be repaired with the fifteenth redundant through-electrode R15 included in the fifteenth redundant through-electrode group RG15.

In the sixteenth through-electrode group SG16, the sixty-first and sixty-third through-electrodes S61 and S63 may be the defective through-electrodes FTE, and thus one of the through-electrodes S61 and S63 may be repaired. For example, the sixty-third through-electrode S63 may be repaired with the sixteenth redundant through-electrode R16 included in the sixteenth redundant through-electrode group RG16. Because the sixteenth redundant through-electrode R16 is already used for repairing the sixty-third through-electrode S63, a signal (e.g., a sixty-first input signal) input to the sixty-first through-electrode S61 may be transmitted to the second through-electrode S2 included in the first through-electrode group SG1 by a second multiplexer connected to the second through-electrode S2.

As described above, even when the repair path search for all of the through-electrodes S1 to S64 are performed once, the repair path search for the second through electrode S2 may not be completed because the second through electrode S2 receives the signal (e.g., the sixty-first input signal) input to the sixty-first through-electrode S61, and thus the repair path search may be sequentially performed again.

In the first through-electrode group SG1 again, the second through-electrode S2 may receive the signal (e.g., the sixty-first input signal input to the sixty-first through-electrode S61) from the sixteenth through-electrode group SG16, and the first redundant through-electrode R1 is already used for repairing the third through-electrode S3. Thus, a signal (e.g., the second input signal IS2) input to the second through-electrode S2 may be transmitted to the eighth through-electrode S8 included in the second through-electrode group SG2 by the eighth multiplexer MUX8 connected to the eighth through-electrode S8.

In the second through-electrode group SG2 again, the eighth through-electrode S8 may receive the signal (e.g., the second input signal IS2 input to the second through-electrode S2) from the first through-electrode group SG1, and thus the eighth through-electrode S8 may be repaired with the second redundant through-electrode R2 included in the second redundant through-electrode group RG2.

As the eighth through-electrode S8 is repaired with the second redundant through-electrode R2, the repair process may be finally completed. Each signal input to each through-electrode may be transmitted to an adjacent normal through-electrode in the directions of arrows. Each signal may be finally transmitted to the redundant through-electrode, and thus all signals may be sent from one chip (or die) to another chip without the signal collision. In addition, the repair path search may not be performed more than three times for the same through-electrode even in the worst case, and thus the repair process may be rapidly and efficiently performed.

Figure 9:
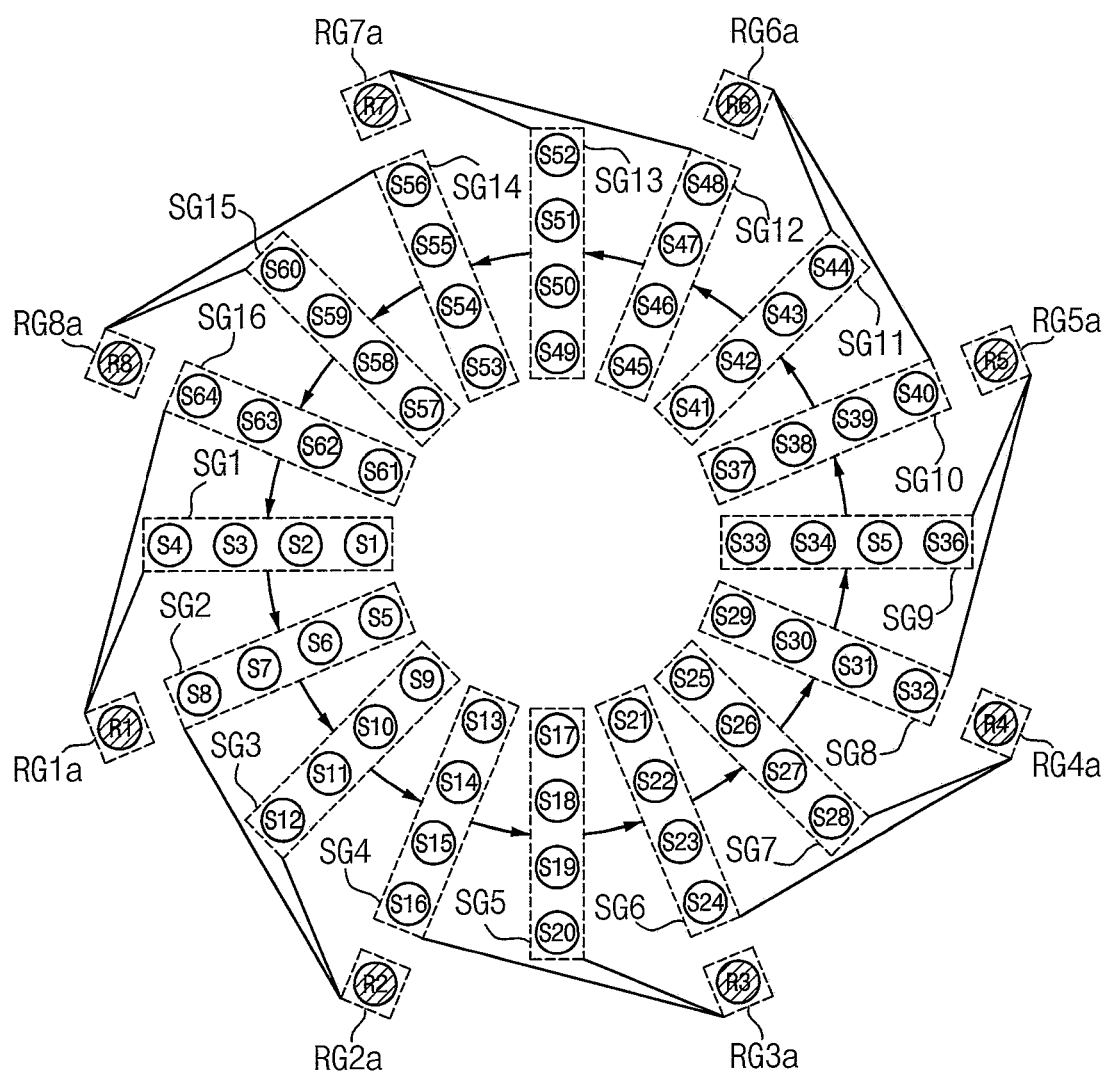
FIG. 9 is a diagram illustrating an example of grouping through-electrodes and redundant through-electrodes for a repair operation performed according to example embodiments.

FIG. 9 is a diagram illustrating an example of grouping through-electrodes and redundant through-electrodes for a repair operation performed according to example embodiments. The descriptions repeated with FIGS. 5 and 6 will be omitted.

Referring to FIG. 9, an example of grouping the through-electrodes and the redundant through-electrodes is illustrated in a plan view. In an example of FIG. 9, the number of through-electrodes STE may be sixty four, the number of redundant through-electrodes RTE may be eight, the number of through-electrode groups may be sixteen, the number of redundant through-electrode groups may be eight, four through-electrodes may be included in one through-electrode group, and one redundant through-electrode may be included in one redundant through-electrode group (e.g., N=64, M=16, K=4, n=8, m=8, k=1).

The example of FIG. 9 may be substantially the same as the example of FIG. 6, except that the number of redundant through-electrode groups RG1a, RG2a, RG3a, RG4a, RG5a, RG6a, RG7a and RG8a is less than the number of the through-electrode groups SG1 to SG16. The through-electrodes S1 to S64 and the through-electrode groups SG1 to SG16 in FIG. 9 may be substantially the same as described with reference to FIGS. 5 and 6.

The first redundant through-electrode group RG1a may correspond to the first and sixteenth through-electrode groups SG1 and SG16, and may include a first redundant through-electrode R1. The second redundant through-electrode group RG2a may correspond to the second and third through-electrode groups SG2 and SG3, and may include a second redundant through-electrode R2. The third redundant through-electrode group RG3a may correspond to the fourth and fifth through-electrode groups SG4 and SG5, and may include a third redundant through-electrode R3. The fourth redundant through-electrode group RG4a may correspond to the sixth and seventh through-electrode groups SG6 and SG7, and may include a fourth redundant through-electrode R4. The fifth redundant through-electrode group RG5a may correspond to the eighth and ninth through-electrode groups SG8 and SG9, and may include a fifth redundant through-electrode R5. The sixth redundant through-electrode group RG6a may correspond to the tenth and eleventh through-electrode groups SG10 and SG11, and may include a sixth redundant through-electrode R6. The seventh redundant through-electrode group RG7a may correspond to the twelfth and thirteenth through-electrode groups SG12 and SG13, and may include a seventh redundant through-electrode R7. The eighth redundant through-electrode group RG8a may correspond to the fourteenth and fifteenth through-electrode groups SG14 and SG15, and may include an eighth redundant through-electrode R8.

In some example embodiments, a router circuit connected to the through-electrodes S1 to S64 and the redundant through-electrodes R1 to R8 in FIG. 9 may include a plurality of multiplexers and a plurality of redundant multiplexers. For example, each of the plurality of multiplexers and the plurality of redundant multiplexers may be a 4:1 multiplexer, and may have a configuration substantially the same as that illustrated in FIG. 7. However, example embodiments are not limited thereto, and each of the plurality of multiplexers and the plurality of redundant multiplexers may be an 8:1 multiplexer.

Figure 10:
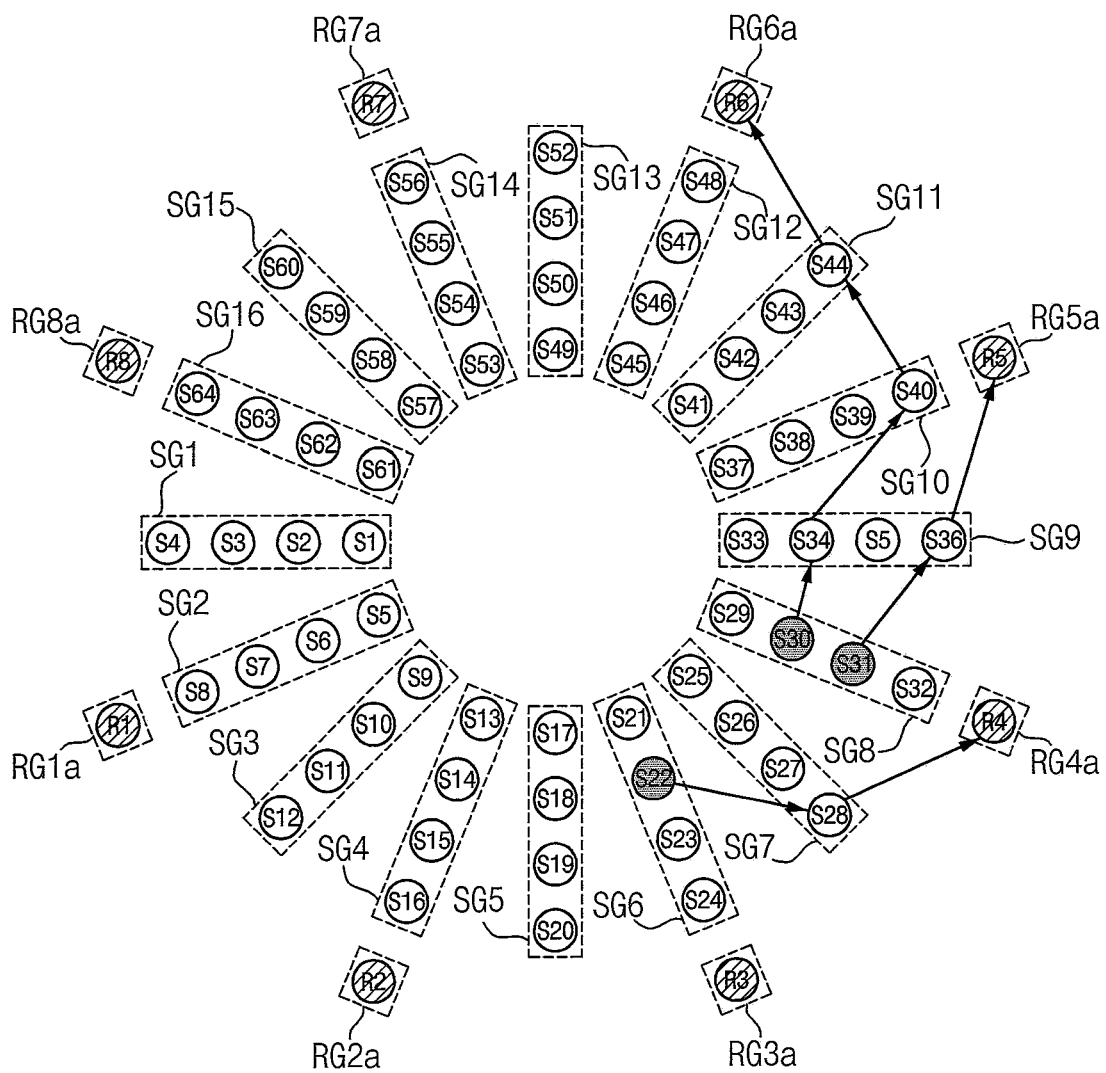
FIG. 10 is a diagram illustrating an example of a result of performing a method of repairing through-electrodes according to example embodiments.

FIG. 10 is a diagram illustrating an example of a result of performing a method of repairing through-electrodes according to example embodiments. The descriptions repeated with FIG. 8 will be omitted.

Referring to FIG. 10, an example of a result of performing the method of repairing the through-electrodes according to example embodiments is illustrated in a plan view. In an example of FIG. 10, the through-electrodes S1 to S64, the through-electrode groups SG1 to SG16, the redundant through-electrodes R1 to R8 and the redundant through-electrode groups RG1a to RG8a may be implemented as illustrated in FIG. 9, the router circuit may be implemented similar to that illustrated in FIG. 7, and some through-electrodes S22, S30 and S31 may be determined as defective through-electrodes FTE to perform the repair operation.

In the sixth through-electrode group SG6, the twenty-second through-electrode S22 may be the defective through electrode FTE, and thus a signal (e.g., a twenty-second input signal) input to the twenty-second through-electrode S22 may be transmitted to the twenty-eighth through-electrode S28 included in the seventh through-electrode group SG7.

In the seventh through-electrode group SG7, the twenty-eighth through-electrode S28 may receive the signal (e.g., the twenty-second input signal) from the sixth through-electrode group SG6, and thus the twenty-eighth through-electrode S28 may be repaired with the fourth redundant through-electrode R4 included in the fourth redundant through-electrode group RG4a.

In the eighth through-electrode group SG8, the thirtieth and the thirty-first through-electrodes S30 and S31 may be the defective through-electrodes FTE. Thus, signals (e.g., thirtieth and thirty-first input signals) input to the thirtieth and the thirty-first through-electrodes S30 and S31 may be transmitted to the thirty-fourth and the thirty-sixth through-electrodes S34 and S36 included in the ninth through-electrode group SG9, respectively.

In the ninth through-electrode group SG9, the thirty-fourth and the thirty-sixth through-electrodes S34 and S36 may receive the signals (e.g., the thirtieth and the thirty-first input signals) from the eighth through-electrode group SG8, and thus one of the through-electrodes S34 and S36 may be repaired. For example, the thirty-sixth through-electrode S36 may be repaired with the fifth redundant through-electrode R5 included in the fifth redundant through-electrode group RG5a. Because the fifth redundant through-electrode R5 is already used, a signal (e.g., a thirty-fourth input signal) input to the thirty-fourth through-electrode S34 may be transmitted to the fortieth through-electrode S40 included in the tenth through-electrode group SG10.

In the tenth through-electrode group SG10, the fortieth through-electrode S40 may receive the signal (e.g., the thirty-fourth input signal) from the ninth through-electrode group SG9, and thus a signal (e.g., a fortieth input signal) input to the fortieth through-electrode S40 may be transmitted to the forty-fourth through-electrode S44 included in the eleventh through-electrode group SG11.

In the eleventh through-electrode group SG11, the forty-fourth through-electrode S44 may receive the signal (e.g., the fortieth input signal) from the tenth through-electrode group SG10, and thus the forty-fourth through-electrode S44 may be repaired with the sixth redundant through-electrode R6 included in the sixth redundant through-electrode group RG6a.

Accordingly, the repair process may be finally completed.

Figure 11:
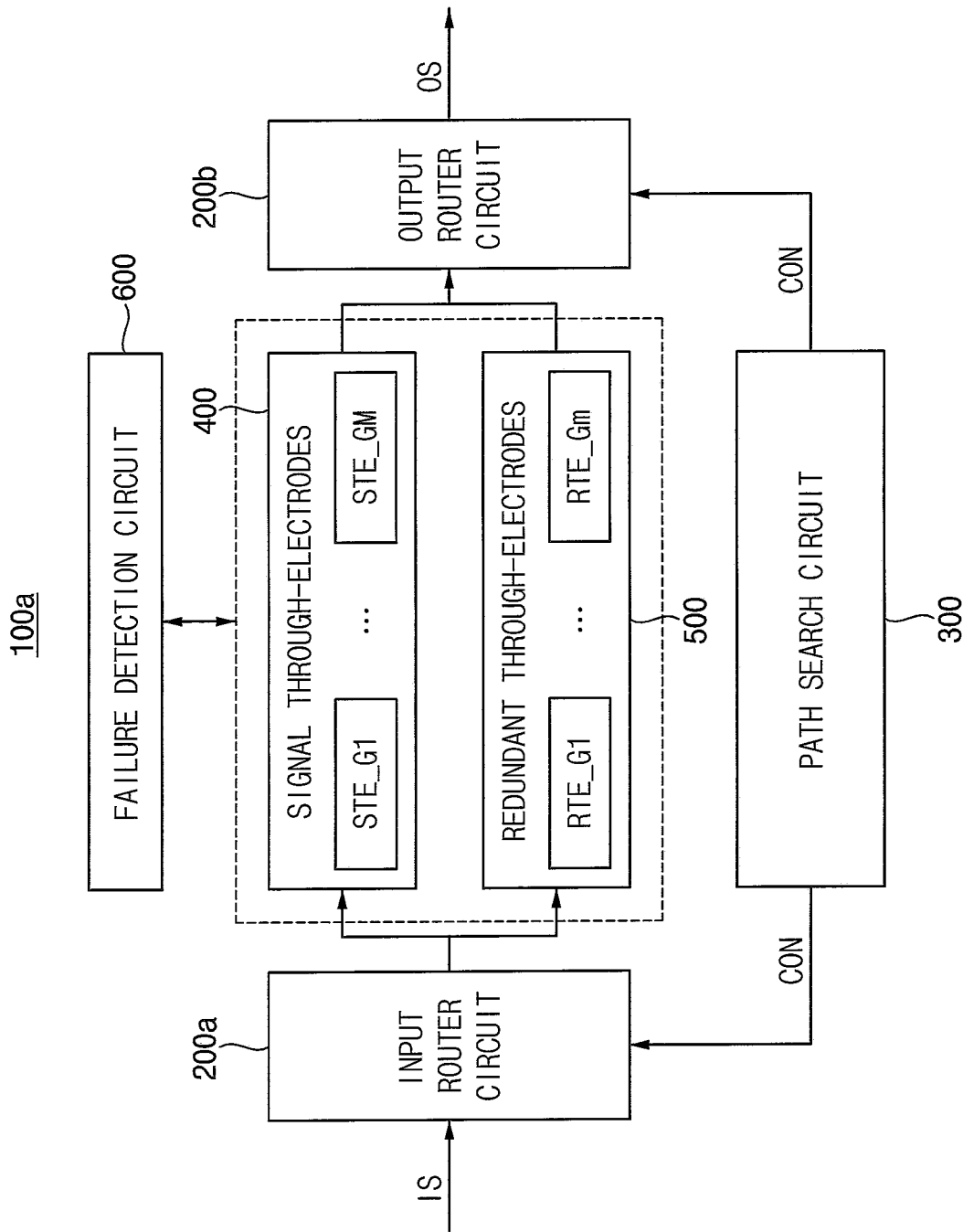
FIG. 11 is a block diagram illustrating a repair device according to example embodiments.

FIG. 11 is a block diagram illustrating a repair device according to example embodiments. The descriptions repeated with FIG. 3 will be omitted.

Referring to FIG. 11, a repair device 100a includes router circuits 200a and 200b and a path search circuit 300. The repair device 100a may further include a failure detection circuit 600.

The repair device 100a may be substantially the same as the repair device 100 of FIG. 2, except that the repair device 100a further includes the failure detection circuit 600.

The failure detection circuit 600 may detect whether one or more of the plurality of through-electrodes 400 are defective. In addition, the failure detection circuit 600 may detect whether one or more of the plurality of redundant through-electrodes 500 are defective.

In the method of repairing the through-electrodes and the repair device according to example embodiments, the through-electrodes and the redundant through-electrodes may be grouped, respectively. When a through-electrode included in a specific through-electrode group is the defective through-electrode, the defective through-electrode may be preferentially repaired using the redundant through-electrode included in the corresponding redundant through-electrode group. When the number of defective through-electrodes in a specific through-electrode group is greater than the number of redundant through-electrodes included in the corresponding redundant through-electrode group, the defective through-electrode may be repaired using the redundant through-electrode included in the next or adjacent redundant through-electrode group. Accordingly, a relatively high repair rate may be achieved using a relatively small number of redundant through-electrodes.

In addition, the repair device performing the above-described repair path search may include the router circuit and the path search circuit, which have a relatively small size, and thus the complexity of circuits may be reduced and it may be efficient for hardware overhead. Additionally, the repair path search may be easily, quickly and/or efficiently performed.

Figure 12:
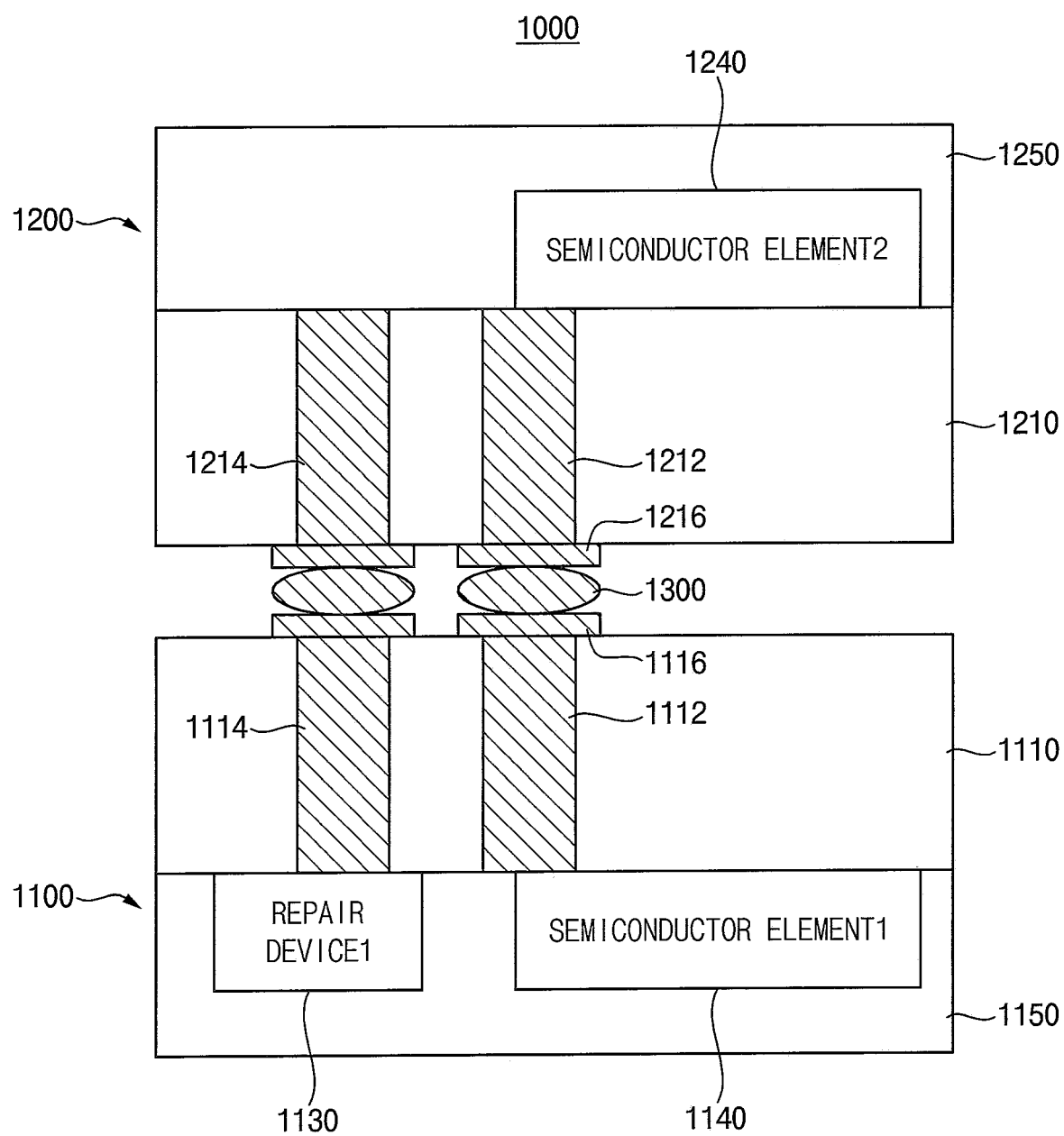
FIGS. 12 and 13 are cross-sectional views of a semiconductor device including a repair device according to example embodiments.
Figure 13:
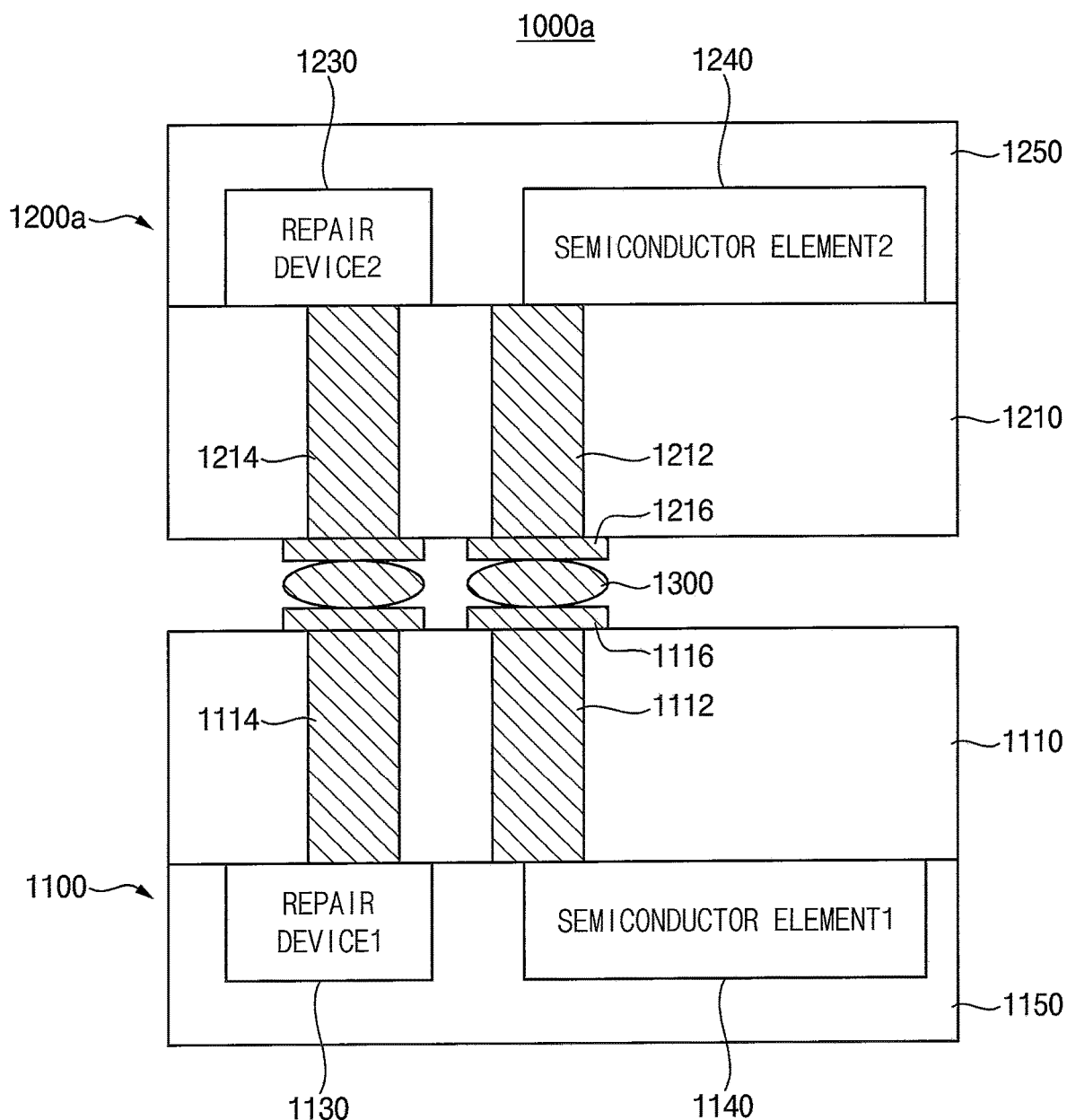

FIGS. 12 and 13 are cross-sectional views of a semiconductor device including a repair device according to example embodiments.

Referring to FIG. 12, a semiconductor device 1000 includes a first semiconductor chip 1100, a second semiconductor chip 1200 and a first repair device 1130.

The first semiconductor chip 1100 includes a first semiconductor substrate 1110, a plurality of first through-electrodes 1112, a plurality of first redundant through-electrodes 1114 and a plurality of first semiconductor elements 1140. The plurality of first through-electrodes 1112 are formed to penetrate the first semiconductor substrate 1110. The plurality of first redundant through-electrodes 1114 are formed to penetrate the first semiconductor substrate 1110, and are used to replace one or more of the plurality of first through-electrodes 1112 when one or more of the plurality of first through-electrodes 1112 are defective. The first semiconductor chip 1100 may further include a first pad 1116 and a first sealing member 1150.

The second semiconductor chip 1200 includes a second semiconductor substrate 1210, a plurality of second through-electrodes 1212, a plurality of second redundant through-electrodes 1214 and a plurality of second semiconductor devices 1240. The plurality of second through-electrodes 1212 are formed to penetrate the second semiconductor substrate 1210. The plurality of second redundant through-electrodes 1214 are formed to penetrate the second semiconductor substrate 1210, and are used to replace one or more of the plurality of second through-electrodes 1212 when one or more of the plurality of second through-electrodes 1212 are defective. The second semiconductor chip 1200 may further include a second pad 1216 and a second sealing member 1250.

The first and second semiconductor chips 1100 and 1200 may be vertically stacked, and may be electrically connected by the plurality of first and second through-electrodes 1112 and 1212, the first and second pads 1116 and 1216, and an electrical connection structure 1300.

The first repair device 1130 is configured to perform a repair operation on the plurality of first and second through-electrodes 1112 and 1212 using the plurality of first and second redundant through-electrodes 1114 and 1214. The first repair device 1130 may be the repair device according to example embodiments, and may be configured to perform the method of repairing the through-electrodes according to example embodiments.

The first repair device 1130 may be included in one of the first and second semiconductor chips 1100 and 1200 and may be configured to perform a built-in self-repair (BISR) operation. For example, as illustrated in FIG. 12, the first repair device 1130 may be included in the first semiconductor chip 1100. However, example embodiments are not limited thereto, and the first repair device 1130 may be included in the second semiconductor chip 1200.

The semiconductor substrates 1110 and 1210 may correspond to the semiconductor substrates 10 and 20 in FIG. 4, the through-electrodes 1112 and 1212 and the redundant through-electrodes 1114 and 1214 may correspond to the through-electrodes 12 and 22 in FIG. 4, the pads 1116 and 1216 may correspond to the pads 14 and 24 in FIG. 4, and the electrical connection structure 1300 may correspond to the electrical connection structure 30 in FIG. 4. The semiconductor chips 1100 and 1200 may include various semiconductor elements 1140 and 1240 (e.g., a memory, a logic circuit, a transistor, and/or the like) and wirings for driving or operating the semiconductor chips 1100 and 1200. The semiconductor elements 1140 and 1240 and the first repair device 1130 may be fixed or sealed by the sealing members 1150 and 1250.

In some example embodiments, each of the semiconductor chips 1100 and 1200 may include a memory device and/or a logic semiconductor device. For example, the memory device may include a high bandwidth memory (HBM) device. For example, the logic semiconductor device may operate as a host device, and may include a central processing unit (CPU), a graphic processing unit (GPU), a system-on-chip (SoC), an application specific integrated circuit (ASIC), or the like.

Referring to FIG. 13, a semiconductor device 1000a includes a first semiconductor chip 1100, a second semiconductor chip 1200a, a first repair device 1130 and a second repair device 1230. The descriptions repeated with FIG. 12 will be omitted.

The semiconductor device 1000a may be substantially the same as the semiconductor device 1000 of FIG. 12, except that the semiconductor device 1000a further includes the second repair device 1230.

The second repair device 1230 may be configured to perform a repair operation on the plurality of first and second through-electrodes 1112 and 1212 using the plurality of first and second redundant through-electrodes 1114 and 1214. The second repair device 1230 may be the repair device according to example embodiments, and may be configured to perform the method of repairing the through-electrodes according to example embodiments. As two repair devices are applied or used, the speed, accuracy and/or efficiency of the repair operation may be improved or enhanced.

The first repair device 1130 may be included in one of the first and second semiconductor chips 1100 and 1200a, and the second repair device 1230 may be included in the other one of the first and second semiconductor chips 1100 and 1200a. For example, as illustrated in FIG. 13, the first repair device 1130 may be included in the first semiconductor chip 1100, and the second repair device 1230 may be included in the second semiconductor chip 1200a.

The inventive concept may be applied to various electronic devices and systems that include the semiconductor devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of repairing through-electrodes, comprising:
grouping a plurality of through-electrodes into a plurality of through-electrode groups arranged in a circular structure, the plurality of through-electrodes being configured for signal transmissions, each through-electrode group including two or more through-electrodes;
grouping a plurality of redundant through-electrodes into a plurality of redundant through-electrode groups, the plurality of redundant through-electrodes being configured to replace the plurality of through-electrodes in response to the plurality of through-electrodes being defective, each redundant through-electrode group including at least one redundant through-electrode and corresponding to at least one through-electrode group; and
searching repair paths for the plurality of through-electrodes, and
wherein searching the repair paths includes:
in response to a Y-th through-electrode included in an X-th through-electrode group being a defective through-electrode or in response to receiving a first signal from an (X−1)-th through-electrode group, determining whether a y-th redundant through-electrode included in an x-th redundant through-electrode group corresponding to the X-th through-electrode group is available for performing signal transmission thereto, where X is a natural number greater than or equal to one and less than or equal to M, where Y is a natural number greater than or equal to one and less than or equal to N, where x is a natural number greater than or equal to one and less than or equal to m, where y is a natural number greater than or equal to one and less than or equal to n;
in response to the y-th redundant through-electrode being available for performing signal transmission thereto, transmitting a second signal input to the Y-th through-electrode to the y-th redundant through-electrode; and
in response to the y-th redundant through-electrode being unavailable for performing signal transmission thereto, transmitting the second signal input to the Y-th through-electrode to an (X+1)-th through-electrode group.

2. The method of claim 1, wherein searching the repair paths further includes:
in response to the Y-th through-electrode being a normal through-electrode and in response to non-receiving the first signal from the (X−1)-th through-electrode group, terminating a repair path search for the Y-th through-electrode and performing a repair path search for a (Y+1)-th through-electrode included in the X-th through-electrode group.

3. The method of claim 2, wherein searching the repair paths further includes:
in response to a repair path search being completed for all of the plurality of through-electrodes, declaring repair completion.

4. The method of claim 1, wherein searching the repair paths further includes:
in response to the y-th redundant through-electrode being unavailable for performing signal transmission thereto and in response to the (X+1)-th through-electrode group being unavailable for performing signal transmission thereto, declaring repair failure.

5. The method of claim 1, wherein:
in response to the y-th redundant through-electrode being unavailable for performing signal transmission thereto, the second signal input to the Y-th through-electrode is transmitted to a Z-th through-electrode included in the (X+1)-th through-electrode group, where Z is a natural number greater than Y and less than or equal to N, and a third signal input to the Z-th through-electrode is transmitted to a z-th redundant through-electrode included in an (x+1)-th redundant through-electrode group corresponding to the (X+1)-th through-electrode group, or is transmitted to an (X+2)-th through-electrode group, where z is a natural number greater than y and less than or equal to n.

6. The method of claim 1, wherein:
the Y-th through-electrode is connected to a Y-th multiplexer, and
the Y-th multiplexer is configured to select one of the first signal received from the (X−1)-th through-electrode group and the second signal input to the Y-th through-electrode and is configured to provide a selected signal to the Y-th through-electrode.

7. The method of claim 6, wherein, in response to the Y-th multiplexer selecting the first signal received from the (X−1)-th through-electrode group and in response to the Y-th multiplexer providing the first signal to the Y-th through-electrode, the second signal input to the Y-th through-electrode is transmitted to the (X+1)-th through-electrode group.

8. The method of claim 1, wherein:
the y-th redundant through-electrode is connected to a y-th redundant multiplexer, and
the y-th redundant multiplexer is configured to select one of signals input to through-electrodes included in the X-th through-electrode group and to provide a selected signal to the y-th redundant through-electrode.

9. The method of claim 1, wherein, among the plurality of through-electrode groups, a first through-electrode group is configured for signal transmission to a second through-electrode group, the second through-electrode group is configured for signal transmission to a third through-electrode group, and an M-th through-electrode group is configured for signal transmission to the first through-electrode group.

10. The method of claim 9, wherein the plurality of through-electrode groups are arranged in a ring shape.

11. The method of claim 1, wherein a number of the plurality of through-electrode groups and a number of the plurality of redundant through-electrode groups are equal to each other.

12. The method of claim 1, wherein a number of the plurality of redundant through-electrode groups is less than a number of the plurality of through-electrode groups.

13. The method of claim 1, wherein the plurality of through-electrodes and the plurality of redundant through-electrodes include a through-silicon via (TSV) penetrating a silicon substrate.

* * * * *